(12) United States Patent
Kim

(10) Patent No.: US 9,318,420 B2
(45) Date of Patent: Apr. 19, 2016

(54) CHIP STACK PACKAGES, SYSTEM IN PACKAGES INCLUDING THE SAME, AND METHODS OF OPERATING THE SAME

(71) Applicant: SK hynix Inc., Icheon-si, Gyeonggi-do (KR)

(72) Inventor: Moon Soo Kim, Seoul (KR)

(73) Assignee: SK HYNIX INC., Icheon-si (KR)

( * ) Notice: Subject to any disclaimer, the term of this patent is extended or adjusted under 35 U.S.C. 154(b) by 469 days.

(21) Appl. No.: 13/718,222

(22) Filed: Dec. 18, 2012

(65) Prior Publication Data
US 2014/0015147 A1    Jan. 16, 2014

(30) Foreign Application Priority Data
Jul. 13, 2012    (KR) .......................... 10-2012-0076616

(51) Int. Cl.
*H01L 23/488*    (2006.01)
*H01L 23/00*    (2006.01)
*H01L 25/065*    (2006.01)
*G11C 5/06*    (2006.01)

(52) U.S. Cl.
CPC .............. *H01L 23/488* (2013.01); *G11C 5/063* (2013.01); *H01L 24/06* (2013.01); *H01L 24/48* (2013.01); *H01L 24/49* (2013.01); *H01L 25/0652* (2013.01); *H01L 25/0657* (2013.01); H01L 2224/05553 (2013.01); H01L 2224/0612 (2013.01); H01L 2224/48091 (2013.01); H01L 2224/48111 (2013.01); H01L 2224/48145 (2013.01); H01L 2224/48147 (2013.01); H01L 2224/49175 (2013.01); H01L 2225/0651 (2013.01); H01L 2225/06506 (2013.01); H01L 2225/06572 (2013.01); H01L 2924/00014 (2013.01); H01L 2924/13091 (2013.01); H01L 2924/15192 (2013.01)

(58) Field of Classification Search
CPC ...................................................... H01L 23/488
USPC .................. 257/777, 724, 723, 686, 685, 778
See application file for complete search history.

(56) References Cited

U.S. PATENT DOCUMENTS 5,229,657 A * 7/1993 Rackley .......................... 326/26
5,903,513 A * 5/1999 Itou .............................. 365/233.1
(Continued)

FOREIGN PATENT DOCUMENTS

KR    10-2010-0002871 A    1/2010
KR    10-1001635 B1    12/2010
(Continued)

*Primary Examiner* — Sheng Zhu
(74) *Attorney, Agent, or Firm* — William Park & Associates Ltd.

(57) ABSTRACT

A stack package including a first semiconductor chip and second semiconductor chip, the first semiconductor chip including first data I/O pads for transmitting data I/O signals, a first flag pad for receiving a flag signal, and a first buffer for controlling a switching operation between the first data I/O pads and an internal circuit of the first semiconductor chip. The second semiconductor chip includes second data I/O pads for transmitting the data I/O signals, a second flag pad for receiving the flag signal, and a second buffer for controlling a switching operation between the second data I/O pads and an internal circuit of the second semiconductor chip. The first data I/O pads are electrically connected to respective ones of the second data I/O pads through first wires, and the first flag pad is electrically connected to the second flag pad through a second wire. Related methods are also provided.

30 Claims, 11 Drawing Sheets

(56) References Cited

U.S. PATENT DOCUMENTS

| | | | |
|---|---|---|---|
| 6,521,994 B1 * | 2/2003 | Huse et al. | 257/724 |
| 6,665,358 B1 * | 12/2003 | Odagiri | 375/343 |
| 7,994,621 B2 * | 8/2011 | Kim | 257/686 |
| 2010/0091537 A1 * | 4/2010 | Best et al. | 365/51 |
| 2011/0018888 A1 * | 1/2011 | Yang et al. | 345/564 |

FOREIGN PATENT DOCUMENTS

| | | |
|---|---|---|
| KR | 10-2011-0072549 A | 6/2011 |
| KR | 10-1104616 B1 | 1/2012 |

* cited by examiner

CHIP STACK PACKAGES, SYSTEM IN PACKAGES INCLUDING THE SAME, AND METHODS OF OPERATING THE SAME

CROSS-REFERENCE TO RELATED APPLICATION

The present application claims priority under 35 U.S.C 119(a) to Korean Application No. 10-2012-0076616, filed on Jul. 13, 2012, in the Korean Intellectual Property Office, which is incorporated herein by reference in its entirety as set forth in full.

BACKGROUND

Embodiments of the present disclosure generally relate to semiconductor packages and, more particularly, to chip stack packages, system in packages including the same, and methods of operating the same.

In the electronics industry, ultra small and compact semiconductor memory devices with high capacity of data storage ability are increasingly in demand with the development of lighter, smaller, faster, multi-functional, and higher performance portable mobile products. In general, there are two solutions to achieve the high capacity of data storage ability of the semiconductor memory devices. One is to increase the integration density of semiconductor memory chips included in the semiconductor memory devices, and the other is to assemble a plurality of semiconductor memory chips into a single semiconductor package. Much effort, high cost and much time may be required to increase the integration density of semiconductor memory chips. In contrast, the technology for assembling a plurality of semiconductor memory chips into a single semiconductor package may have various advantages in terms of development cost, development time and/or the like. Accordingly, multi chip package techniques for mounting and assembling a plurality of semiconductor memory chips into a single semiconductor package are widely used to improve the data storage ability of the semiconductor memory devices. The multi chip packages may be fabricated using diverse manners. Recently, stack packages fabricated by vertically stacking a plurality of semiconductor chips have been widely provided because stack package techniques have some advantages in terms of fabrication cost and mass production.

In general, the stack packages may have a single channel configuration that transmits signals using a single channel. However, in some application areas of the stack packages, a multi channel configuration transmitting the signals through a plurality of channels may be used to meet the requirement of fast operation speed. In the event that the stack packages employ the multi channel configuration, a plurality of semiconductor chips constituting each of the stack packages may be divided into a plurality of channel groups. Thus, each of the channel groups may need a plurality of signal pads disposed on a package substrate to receive or output input/output (I/O) data. In such a case, however, if the number of the channel groups increases, the number of the signal pads and the number of signal transmission means between the signal pads and the semiconductor chips may also increase. This may lead to an increase of sizes of the semiconductor packages (e.g., the stack packages).

SUMMARY

Various embodiments are directed to chip stack packages, system in packages including the same, and methods of operating the same.

According to various embodiments, a stack package includes a first semiconductor chip on a package substrate and a second semiconductor chip on a side of the first semiconductor chip opposite to the package substrate. The first semiconductor chip includes first data I/O pads for transmitting data I/O signals, a first flag pad for receiving a flag signal, and a first buffer for controlling a switching operation between the first data I/O pads and an internal circuit of the first semiconductor chip. The second semiconductor chip includes second data I/O pads for transmitting the data I/O signals, a second flag pad for receiving the flag signal, and a second buffer for controlling a switching operation between the second data I/O pads and an internal circuit of the second semiconductor chip. The first data I/O pads are electrically connected to respective ones of the second data I/O pads through first wires, and the first flag pad is electrically connected to the second flag pad through a second wire.

In various embodiments, the second semiconductor chip may be disposed on the first semiconductor chip such that the first data I/O pads and the first flag pad are exposed.

In various embodiments, the number of the first data I/O pads may be equal to the number of the data I/O signals, and the number of the second data I/O pads may be equal to the number of the data I/O signals.

In various embodiments, the first semiconductor chip may further include a first power supply terminal for receiving a first power voltage signal, and the second semiconductor chip may further include a second power supply terminal for receiving a second power voltage signal.

In various embodiments, one of the first and second power voltage signals may have a logic "high" level, and the other power voltage signal may have a logic "low" level.

In various embodiments, the first buffer may include an exclusive NOR gate configured to generate an output signal in response to the flag signal and the first power voltage signal and a switching portion configured to control a switching operation between the first data I/O pads and the internal circuit of the first semiconductor chip in response to the output signal of the exclusive NOR gate.

In various embodiments, second buffer may include an exclusive NOR gate configured to generate an output signal in response to the flag signal and the second power voltage signal and a switching portion configured to control a switching operation between the second data I/O pads and the internal circuit of the second semiconductor chip in response to the output signal of the exclusive NOR gate.

In various embodiments, in response to the flag signal, one of the first and second buffers may be switched on to transmit the data I/O signals to the internal circuit of the semiconductor chip including the switched-on buffer and the other buffer may be switched off to electrically disconnect the first wires from the internal circuit of the semiconductor chip including the switched-off buffer.

According to various embodiments, a stack package includes a plurality of semiconductor chips in a first channel group and a plurality of semiconductor chips in a second channel group which are stacked on a package substrate. Each of the plurality of semiconductor chips in the first and second channel groups includes data I/O pads for transmitting data I/O signals, a flag pad for receiving a flag signal, a chip enable pad for receiving a chip enable signal, and a buffer for controlling a switching operation between the data I/O pads and an internal circuit of the corresponding semiconductor chip. The data I/O pads of one of the plurality of semiconductor chips in the first and second channel groups are electrically connected to the data I/O pads of the other semiconductor chips through first wires, and the flag pads of the plurality of semiconductor chips in the first and second channel groups is electrically connected to each other through a second wire. The chip enable pads of the plurality of semiconductor chips in the first channel group are electrically connected to respective ones of the chip enable pads of the plurality of semiconductor chips in the second channel group.

In various embodiments, the plurality of semiconductor chips in the first and second channel groups may be stacked on the package substrate such that at least first edges of the plurality of semiconductor chips in the first and second channel groups exhibit a step shape.

In various embodiments, the number of the data I/O pads of each of the semiconductor chips may correspond to the number of the data I/O signals.

In various embodiments, the number of the semiconductor chips in the first channel group may be equal to the number of the semiconductor chips in the second channel group.

In various embodiments, the number of the semiconductor chips in each of the first and second channel groups may be two. In such a case, a first chip enable signal having a first logic level may be applied to one of the chip enable pads of the semiconductor chips in the first channel group and one of the chip enable pads of the semiconductor chips in the second channel group, and a second chip enable signal having a second logic level may be applied to the other of the chip enable pads of the semiconductor chips in the first channel group and the other of the chip enable pads of the semiconductor chips in the second channel group.

In various embodiments, each of the semiconductor chips may further include a power supply pad for receiving a power voltage signal. A logic level of the power voltage signal applied to the power supply pads of the semiconductor chips in the first channel group may be different from a logic level of the power voltage signal applied to the power supply pads of the semiconductor chips in the second channel group.

In various embodiments, the buffer may include an exclusive NOR gate configured to generate an output signal in response to the flag signal and the power voltage signal, an AND gate configured to generate an output signal in response to the output signal of the exclusive NOR gate and the chip enable signal, and a switching portion configured to control a switching operation between the data I/O pads and the internal circuit of the corresponding semiconductor chip in response to the output signal of the AND gate.

According to various embodiments, a stack package includes at least three channel groups stacked on a package substrate. Each of the at least three channel groups includes a plurality of semiconductor chips. Each of the plurality of semiconductor chips includes data I/O pads for transmitting data I/O signals, a flag pad for receiving a flag signal, a chip enable pad for receiving a chip enable signal, and a buffer for controlling a switching operation between the data I/O pads and an internal circuit of the corresponding semiconductor chip. The data I/O pads of one of the plurality of semiconductor chips are electrically connected to the data I/O pads of the other semiconductor chips through first wires, and the flag pads of the plurality of semiconductor chips in each of the at least three channel groups are electrically connected to each other through a second wire. The chip enable pads in one of the at least three channel groups are electrically connected to respective ones of the chip enable pads in each of the other channel groups.

In various embodiments, the plurality of semiconductor chips in the at least three channel groups may be stacked on the package substrate such that at least first edges of the plurality of semiconductor chips in the at least three channel groups exhibit a step shape.

In various embodiments, the number of the data I/O pads of each of the semiconductor chips may correspond to the number of the data I/O signals.

In various embodiments, the number of the semiconductor chips in one of the at least three channel groups may be equal to the number of the semiconductor chips in each of the other channel groups.

In various embodiments, the stack package may further include substrate pads disposed on the package substrate and electrically connected to the flag pads of the semiconductor chips. The number of the substrate pads may be equal to the number of the at least three channel groups.

In various embodiments, the number of the semiconductor chips in each of the first and second channel groups may be two. In such a case, a first chip enable signal having a first logic level may be applied to one of the chip enable pads of the semiconductor chips in each of the at least three channel groups, and a second chip enable signal having a second logic level may be applied to the other of the chip enable pads of the semiconductor chips in each of the at least three channel groups.

In various embodiments, the buffer may include an AND gate configured to generate an output signal in response to the chip enable signal and the flag signal and a switching portion configured to control a switching operation between the data I/O pads and the internal circuit of the corresponding semiconductor chip in response to the output signal of the AND gate.

BRIEF DESCRIPTION OF THE DRAWINGS

Embodiments of the inventive concept will become more apparent in view of the attached drawings and accompanying detailed description, in which.

DETAILED DESCRIPTION

Figure 1:
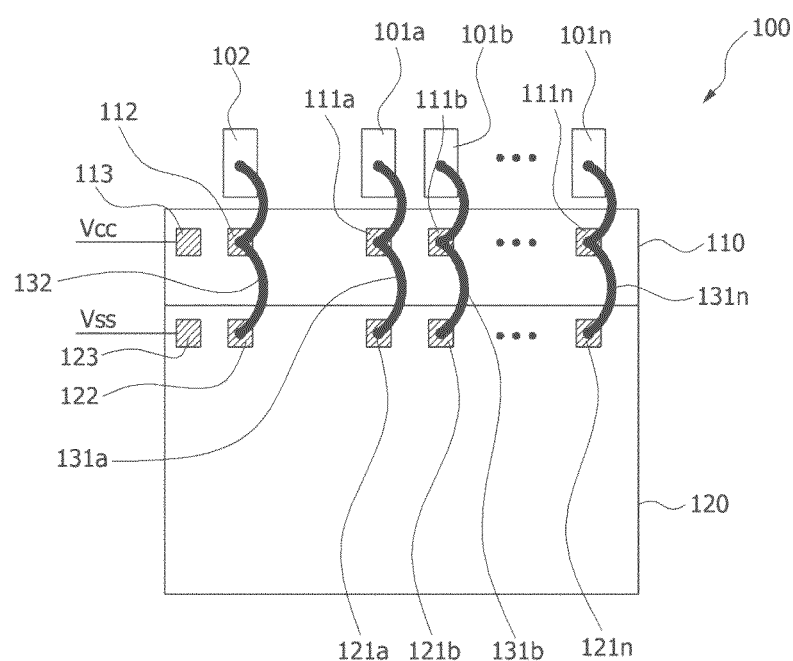
FIG. 1 is a plan view illustrating a single channel stack package according to an embodiment.

FIG. 1 is a plan view illustrating a single channel stack package according to an embodiment. Referring to FIG. 1, a stack package 100 according to an embodiment may be configured to include a first semiconductor chip 110 and a second semiconductor chip 120 which may be sequentially stacked on a package substrate (not shown). The package substrate may include a plurality of first pads 101a, 101b, ... and 101n, and a second pad 102 which are disposed on a surface thereof. In various embodiments, the first and second semiconductor chips 110 and 120 may be flash memory chips, but not limited thereto. For example, the first and second semiconductor chips 110 and 120 may be magnetic random access memory (MRAM) chips, phase change random access memory (PRAM) chips or the like. The first semiconductor chip 110 may include a plurality of first data input/output (I/O) pads 111a, 111b, ... and 111n, at least one first flag pad 112, and a first buffer (not shown). The plurality of first data I/O pads 111a, 111b, ... and 111n, and the at least one first flag pad 112 may be disposed on a semiconductor substrate of the first semiconductor chip 110, and the first buffer may be disposed in the semiconductor substrate of the first semiconductor chip 110. Similarly, the second semiconductor chip 120 may include a plurality of second data I/O pads 121a, 121b, ... and 121n, at least one second flag pad 122, and a second buffer (not shown). The plurality of second data I/O pads 121a, 121b, ... and 121n, and the at least one second flag pad 122 may be disposed on a semiconductor substrate of the second semiconductor chip 120, and the second buffer may be disposed in the semiconductor substrate of the second semiconductor chip 120.

The first semiconductor chip 110 may receive or output I/O signals through the first data I/O pads 111a, 111b, ... and 111n, and the second semiconductor chip 120 may receive or output I/O signals through the second data I/O pads 121a, 121b, ... and 121n. The first and second data I/O pads 111a, 111b, ..., 111c, 121a, 121b, ... and 121n may be electrically connected to the first pads 101a, 101b, ... and 101n disposed on the package substrate through first wires 131a, 131b, ... and 131n. The first wires 131a, 131b, ... and 131n are merely examples of suitable connectors for electrically connecting the first and second data I/O pads 111a, 111b, ..., 111c, 121a, 121b, ... and 121n to the first pads 101a, 101b, ... and 101n. Any connection means other than the wires can be used. These replacement options on the first wires 131a, 131b, ... and 131n are equally applicable to all the following embodiments. In various embodiments, the first data I/O pad 111a, the second data I/O pad 121a and the first pad 101a may be electrically connected to each other through the first wire 131a. Thus, an input signal applied to the first pad 101a on the package substrate may be transmitted to the first and second semiconductor chips 110 and 120 through the first wire 131a, and one of output signals outputted from the first or second semiconductor chip 110 or 120 may be transmitted to the first pad 101a on the package substrate through the first wire 131a. Similarly, the first data I/O pad 111b, the second data I/O pad 121b and the first pad 101b may be electrically connected to each other through the first wire 131b. Thus, an input signal applied to the first pad 101b on the package substrate may be transmitted to the first and second semiconductor chips 110 and 120 through the first wire 131b, and one of output signals outputted from the first or second semiconductor chip 110 or 120 may be transmitted to the first pad 101b on the package substrate through the first wire 131b. These connection configurations are equally applicable to the remaining first data I/O pads 111c, ... and 111n, the remaining second data I/O pads 121c, ... and 121n, and the remaining first pads 101c, ... and 101n on the package substrate. That is, the first data I/O pad 111n, the second data I/O pad 121n and the first pad 101n may also be electrically connected to each other through the first wire 131n.

The first and second semiconductor chips 110 and 120 may receive a flag signal (also, referred to as a channel flag signal) through the first and second flag pads 112 and 122, respectively. The first and second flag pads 112 and 122 may be electrically connected to the second pad 102 through a second wire 132. That is, the flag signal applied to the second pad 102 may be transmitted to the first and second flag pads 112 and 122 through the second wire 132. The flag signal may be transmitted to buffers in the first and second semiconductor chips 110 and 120 and may be used as one of switching input signals that control switching operations of internal circuits included in the buffers. The first and second semiconductor chips 110 and 120 may include a first power supply terminal (or a first power supply pad) 113 for receiving a first power voltage signal Vcc and a second power supply terminal (or a second power supply pad) 123 for receiving a second power voltage signal Vss, respectively. The first power voltage signal Vcc may have a different voltage from the second power voltage signal Vss. For example, when the first power voltage signal Vcc has a voltage corresponding to a logic "high" level, the second power voltage signal Vss may have a voltage corresponding to a logic "low" level. The first and second power supply terminals 113 and 123 may be electrically connected to an external power supply or an internal power supply for generating the first and second power voltage signals Vcc and Vss through power supply interconnection lines.

Figure 2:
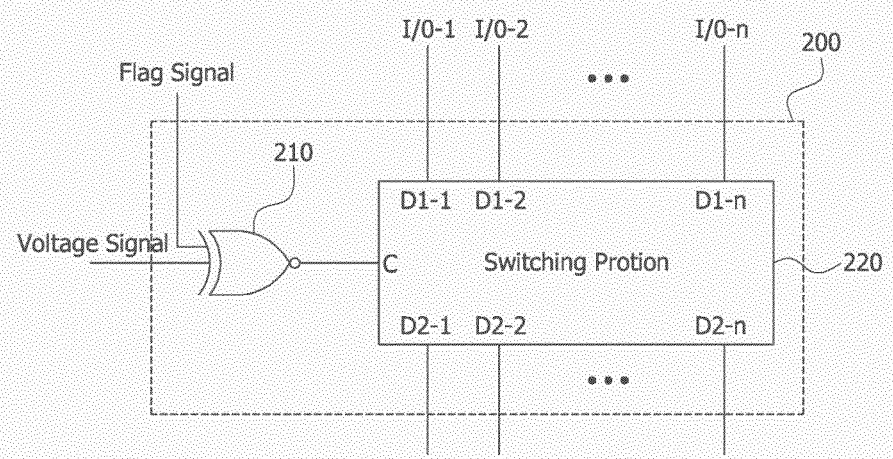
FIG. 2 is a schematic view illustrating an example of a buffer of a semiconductor chip included in a single channel stack package shown in FIG. 1.

FIG. 2 is a schematic view illustrating an example of a first buffer 200 of the first semiconductor chip 110 included in the single channel stack package 100 shown in FIG. 1. The second semiconductor chip 120 of FIG. 1 may also include a second buffer having the same or similar configuration as the first buffer of the first semiconductor chip 110. Thus, descriptions to the second buffer of the second semiconductor chip 120 will be omitted or briefly mentioned in the following examples of the various embodiments. Referring to FIG. 2, the first buffer 200 may be configured to include an exclusive NOR gate 210 and a switching portion 220. The exclusive NOR gate 210 may have two input terminals for receiving the flag signal (or a channel flag signal) and the first power voltage signal Vcc. The second buffer of the second semiconductor chip 120 shown in FIG. 1 may also include an exclusive NOR gate, and the exclusive NOR gate of the second buffer may have two input terminals for receiving the flag signal and the second power voltage signal Vss. An output terminal of the exclusive NOR gate 210 may be electrically connected to a control input terminal C of the switching portion 220. That is, an output signal of the exclusive NOR gate 210 may be transmitted to the switching portion 220 through the control input terminal C. The switching portion 220 may have a plurality of first data I/O terminals D1-1, D1-2, ... and D1-n and a plurality of second data I/O terminals D2-1, D2-2, ... and D2-n. The first data I/O terminals D1-1, D1-2, ... and D1-n may be electrically connected to respective ones of the first data I/O pads 111a, 111b, ... and 111c of the first semiconductor chip 110, and the second data I/O terminals D2-1, D2-2, ... and D2-n may be electrically connected to a main circuit portion (e.g., an internal circuit) of the first semiconductor chip 110. The main circuit portion of the first semiconductor chip 110 may execute main functions of the first semiconductor chip 110. For example, when the first semiconductor chip 110 is a flash memory chip, the main circuit portion of the first semiconductor chip 110 may include address decoders and sense amplifiers for driving and controlling flash memory cells, and I/O buffers. The switching portion 220 may control a switching operation between the first data I/O terminals D1-1, D1-2, . . . and D1-*n* and the second data I/O terminals D2-1, D2-2, . . . and D2-*n* in response to the output signal of the exclusive NOR gate 210. If the first data I/O terminals D1-1, D1-2, . . . and D1-*n* are electrically connected to the second data I/O terminals D2-1, D2-2, . . . and D2-*n*, input/output data signals I/O-1, I/O-2, . . . and I/O-n may be transmitted from the first data I/O terminals D1-1, D1-2, . . . and D1-*n* (or the second data I/O terminals D2-1, D2-2, . . . and D2-*n*) to the second data I/O terminals D2-1, D2-2, . . . and D2-*n* (or the first data I/O terminals D1-1, D1-2, . . . and D1-*n*).

Figure 3:
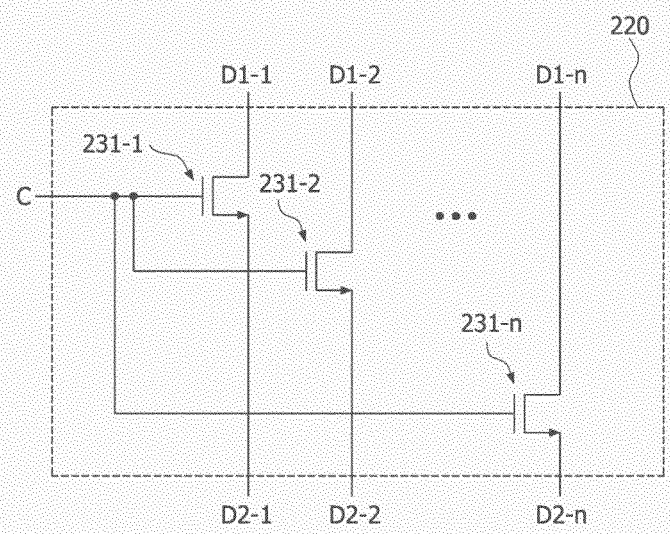
FIG. 3 is a circuit diagram illustrating an example of a switching portion of a buffer shown in FIG. 2.

FIG. 3 is a circuit diagram illustrating an example of the switching portion 220 of the first buffer 200 shown in FIG. 2. Referring to FIG. 3, the switching portion 220 may include a plurality of transistors, for example, a plurality of N-channel MOS transistors (hereinafter, referred to as NMOS transistors) 231-1, 231-2, . . . and 231-*n*. Gate electrodes of the NMOS transistors 231-1, 231-2, . . . and 231-*n* may be electrically connected to the control input terminal C. Thus, the NMOS transistors 231-1, 231-2, . . . and 231-*n* may be simultaneously turned on or turned off according to a signal (e.g., the output signal of the exclusive NOR gate 210) applied to the control input terminal C. Drain electrodes of the NMOS transistors 231-1, 231-2, . . . and 231-*n* may be electrically connected to respective ones of the first data I/O terminals D1-1, D1-2, . . . and D1-*n*, and source electrodes of the NMOS transistors 231-1, 231-2, . . . and 231-*n* may be electrically connected to respective ones of the second data I/O terminals D2-1, D2-2, . . . and D2-*n*. If the NMOS transistors 231-1, 231-2, . . . and 231-*n* are turned on according to the signal applied to the control input terminal C, the NMOS transistors 231-1, 231-2, . . . and 231-*n* may provide signal transmission paths between the first data I/O terminals D1-1, D1-2, . . . and D1-*n* and the second data I/O terminals D2-1, D2-2, . . . and D2-*n*. Thus, the input/output data signals (I/O-1, I/O-2, . . . and I/O-n of FIG. 2) may be transmitted from the first data I/O terminals D1-1, D1-2, . . . and D1-*n* (or the second data I/O terminals D2-1, D2-2, . . . and D2-*n*) to the second data I/O terminals D2-1, D2-2, . . . and D2-*n* (or the first data I/O terminals D1-1, D1-2, . . . and D1-*n*). In contrast, if the NMOS transistors 231-1, 231-2, . . . and 231-*n* are turned off according to the signal applied to the control input terminal C, the NMOS transistors 231-1, 231-2, . . . and 231-*n* may electrically disconnect the first data I/O terminals D1-1, D1-2, . . . and D1-*n* from the second data I/O terminals D2-1, D2-2, . . . and D2-*n*. Accordingly, the input/output data signals (I/O-1, I/O-2, . . . and I/O-n of FIG. 2) may not be transmitted from the first data I/O terminals D1-1, D1-2, . . . and D1-*n* (or the second data I/O terminals D2-1, D2-2, . . . and D2-*n*) to the second data I/O terminals D2-1, D2-2, . . . and D2-*n* (or the first data I/O terminals D1-1, D1-2, . . . and D1-*n*).

The overall data transmission operations of the single channel stack package will be described hereinafter with reference to FIGS. 1, 2, and 3. Referring again to FIGS. 1, 2, and 3, if the input/output data signals I/O-1, I/O-2, . . . and I/O-n are applied to the first pads 101*a*, . . . and 101*n* on the package substrate, the input/output data signals I/O-1, I/O-2, . . . and I/O-n may be transmitted to the first and second data I/O pads 111*a*, 111*b*, . . . , 111*n*, 121*a*, 121*b*, 121*c*, . . . and 121*n* of the first and second semiconductor chips 110 and 120 through the first wires 131*a*, 131*b*, . . . and 131*n*. In addition to the input/output data signals I/O-1, I/O-2, . . . and I/O-n, the flag signal may be applied to the second pad 102 on the package substrate and the flag signal may be transmitted to the first and second flag pads 112 and 122 of the first and second semiconductor chips 110 and 120 through the second wire 132. Further, the first power voltage signal Vcc may be applied to the first power supply terminal 113 of the first semiconductor chip 110, and the second power voltage signal Vss may be applied to the second power supply terminal 123 of the second semiconductor chip 120.

The input/output data signals I/O-1, I/O-2, . . . and I/O-n introduced into the first semiconductor chip 110 may be transmitted to the first data I/O terminals D1-1, D1-2, . . . and D1-*n* of the first buffer 200 in the first semiconductor chip 110. Similarly, the input/output data signals I/O-1, I/O-2, . . . and I/O-n introduced into the second semiconductor chip 120 may be transmitted to first data I/O terminals of the second buffer in the second semiconductor chip 120. The second buffer of the second semiconductor chip 120 may have the same or similar configuration as the first buffer 200 of the first semiconductor chip 110. Thus, descriptions to the second buffer of the second semiconductor chip 120 will be omitted or briefly mentioned hereinafter. The flag signal and the first power voltage signal Vcc may be applied to the input terminals of the exclusive NOR gate 210 at a point of time that the input/output data signals I/O-1, I/O-2, . . . and I/O-n are applied to the first data I/O terminals D1-1, D1-2, . . . and D1-*n* of the first buffer 200. Alternatively, the flag signal and the first power voltage signal Vcc may be applied to the input terminals of the exclusive NOR gate 210 after the input/output data signals I/O-1, I/O-2, . . . and I/O-n are applied to the first data I/O terminals D1-1, D1-2, . . . and D1-*n* of the first buffer 200. The exclusive NOR gate 210 may generate an output signal having a logic "high" level or a logic "low" level in response to the flag signal and the first power voltage signal Vcc. For example, when both the flag signal and the first power voltage signal Vcc have the same logic level, the exclusive NOR gate 210 may generate an output signal having a logic "high" level. Alternatively, when the flag signal has a different logic level from the first power voltage signal Vcc, the exclusive NOR gate 210 may generate an output signal having a logic "low" level.

As described above, the first power voltage signal Vcc may have a different logic level from the second power voltage signal Vss. For example, the first power voltage signal Vcc may have a logic "high" level and the second power voltage signal Vss may have a logic "low" level. In such a case, if the flag signal has a logic "high" level, the exclusive NOR gate 210 of the first semiconductor chip 110 may generate an output signal having a logic "high" level while the exclusive NOR gate of the second semiconductor chip 120 may generate an output signal having a logic "low" level. This is because the flag signal and the first power voltage signal Vcc used as the input signals of the exclusive NOR gate 210 of the first semiconductor chip 110 have the same logic level while the flag signal and the second power voltage signal Vss used as the input signals of the exclusive NOR gate of the second semiconductor chip 120 have different logic levels from each other. That is, when the flag signal has a logic "high" level, the switching portion 220 of the first semiconductor chip 110 may be in a turned-on state and the switching portion of the second semiconductor chip 120 may be in a turned-off state. Accordingly, the input/output data signals I/O-1, I/O-2, . . . and I/O-n may be transmitted to the main circuit portion of the first semiconductor chip 110 while the input/output data signals I/O-1, I/O-2, . . . and I/O-n may not be transmitted to the main circuit portion of the second semiconductor chip 120. In contrast, if the flag signal has a logic "low" level, the exclusive NOR gate 210 of the first semiconductor chip 110 may generate an output signal having a logic "low" level while the exclusive NOR gate of the second semiconductor chip 120 may generate an output signal having a logic "high" level. This is because the flag signal and the first power voltage signal Vcc used as the input signals of the exclusive NOR gate 210 of the first semiconductor chip 110 have different logic levels from each other while the flag signal and the second power voltage signal Vss used as the input signals of the exclusive NOR gate of the second semiconductor chip 120 have the same logic level. That is, when the flag signal has a logic "low" level, the switching portion 220 of the first semiconductor chip 110 may be in a turned-off state and the switching portion of the second semiconductor chip 120 may be in a turned-on state. Accordingly, the input/output data signals I/O-1, I/O-2, . . . and I/O-n may not be transmitted to the main circuit portion of the first semiconductor chip 110 while the input/output data signals I/O-1, I/O-2, . . . and I/O-n may be transmitted to the main circuit portion of the second semiconductor chip 120. Thus, even though the input/output data signals I/O-1, I/O-2, . . . and I/O-n are transmitted to the first and second data I/O pads 111a, 111b, . . . , 111n, 121a, 121b, . . . and 121n of the first and second semiconductor chips 110 and 120, the input/output data signals I/O-1, I/O-2, . . . and I/O-n may be transmitted to only one of the main circuit portions of the first and second semiconductor chips 110 and 120 according to a logic level of the flag signal.

Figure 4:
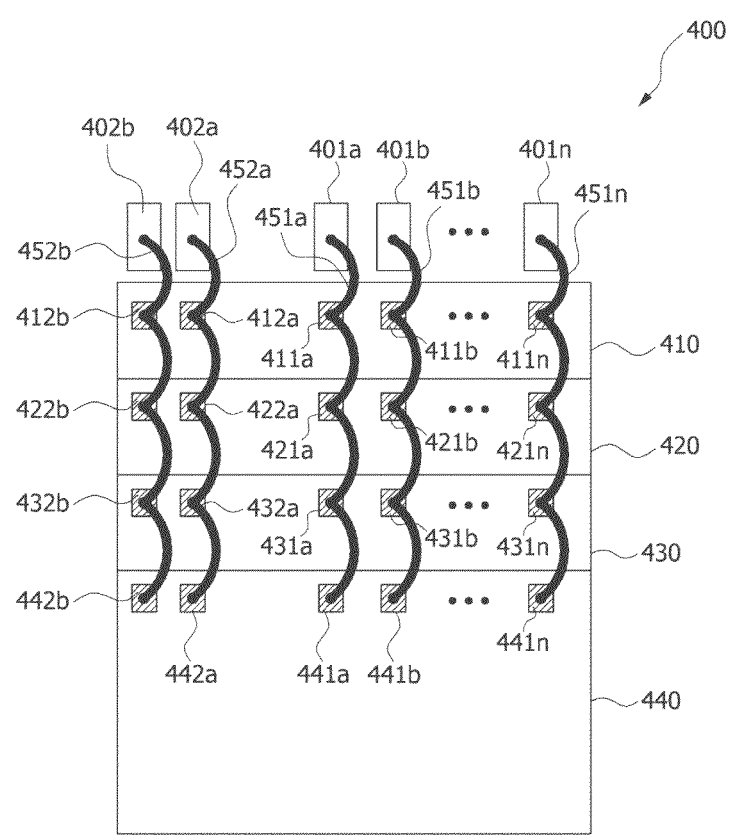
FIG. 4 is a plan view illustrating a single channel stack package according to an embodiment.

FIG. 4 is a plan view illustrating a single channel stack package according to an embodiment. Referring to FIG. 4, a stack package 400 according to an embodiment may be configured to include at least three semiconductor chips. For example, the stack package 400 may be configured to include a first semiconductor chip 410, a second semiconductor chip 420, a third semiconductor chip 430, and a fourth semiconductor chip 440 stacked on a package substrate (not shown). The package substrate may include a plurality of first pads 401a, 401b, . . . and 401n, and second pads 402a and 402b which are disposed on a surface thereof. In various embodiments, the first to fourth semiconductor chips 410, 420, 430, and 440 may be flash memory chips, but not limited thereto. For example, the first to fourth semiconductor chips 410, 420, 430 and 440 may be magnetic random access memory (MRAM) chips, phase change random access memory (PRAM) chips or the like. The first pads 401a, 401b, . . . and 401n may act as bond fingers for transmitting signals, and the second pads 402a and 402b may act as bond fingers for transmitting flag signals. In various embodiments, the number of the second pads 402a and 402b may be two, as illustrated in FIG. 4. However, the number of the second pads may not be limited to two. The number of the second pads may depend on the number of the semiconductor chips stacked on the package substrate. Specifically, when the number of the second pads is "n", the number of the semiconductor chips stacked on the package substrate may be "2ⁿ". For example, the number of the second pads may be three when eight semiconductor chips are stacked on the package substrate and the number of the second pads may be four when sixteen semiconductor chips are stacked on the package substrate.

The first semiconductor chip 410 may include a plurality of first data I/O pads 411a, 411b, . . . and 411n, a pair of first flag pads 412a and 412b, and a first buffer (not shown). The first data I/O pads 411a, 411b, . . . and 411n, and the pair of first flag pads 412a and 412b may be disposed on a semiconductor substrate of the first semiconductor chip 410, and the first buffer may be disposed in the semiconductor substrate of the first semiconductor chip 410. The second semiconductor chip 420 may include a plurality of second data I/O pads 421a, 421b, . . . and 421n, a pair of second flag pads 422a and 422b, and a second buffer (not shown). The second data I/O pads 421a, 421b, . . . and 421n, and the pair of second flag pads 422a and 422b may be disposed on a semiconductor substrate of the second semiconductor chip 420, and the second buffer may be disposed in the semiconductor substrate of the second semiconductor chip 420. The third semiconductor chip 430 may include a plurality of third data I/O pads 431a, 431b, . . . and 431n, a pair of third flag pads 432a and 432b, and a third buffer (not shown). The third data I/O pads 431a, 431b, . . . and 431n, and the pair of third flag pads 432a and 432b may be disposed on a semiconductor substrate of the third semiconductor chip 430, and the third buffer may be disposed in the semiconductor substrate of the third semiconductor chip 430. The fourth semiconductor chip 440 may include a plurality of fourth data I/O pads 441a, 441b, . . . and 441n, a pair of fourth flag pads 442a and 442b, and a fourth buffer (not shown). The fourth data I/O pads 441a, 441b, . . . and 441n, and the pair of fourth flag pads 442a and 442b may be disposed on a semiconductor substrate of the fourth semiconductor chip 440, and the fourth buffer may be disposed in the semiconductor substrate of the fourth semiconductor chip 440.

The first, second, third, and fourth semiconductor chips 410, 420, 430, and 440 may receive or output the data I/O signals through the first data I/O pads 411a, 411b, . . . and 411n, the second data I/O pads 421a, 421b, . . . and 421n, the third data I/O pads 431a, 431b, . . . and 431n, and the fourth data I/O pads 441a, 441b, . . . and 441n, respectively. The first, second, third and fourth data I/O pads 411a, 411b, . . . , 411c, 421a, 421b, . . . , 421n, 431a, 431b, . . . , 431n, 441a, 441b, . . . and 441n may be electrically connected to the first pads 401a, 401b, . . . and 401n disposed on the package substrate through first wires 451a, 451b, . . . and 451n. That is, the first, second, third, and fourth data I/O pads 411a, 421a, 431a, and 441a, and the first pad 401a may be electrically connected to each other through the first wire 451a. Thus, an input signal applied to the first pad 401a on the package substrate may be transmitted to the first, second, third, and fourth semiconductor chips 410, 420, 430, and 440 through the first wire 451a, and one of output signals outputted from the first, second, third, or fourth semiconductor chip 410, 420, 430 or 440 may be transmitted to the first pad 401a on the package substrate through the first wire 451a. Similarly, the first, second, third, and fourth data I/O pads 411b, 421b, 431b, and 441b, and the first pad 401b may be electrically connected to each other through the first wire 451b. Thus, an input signal applied to the first pad 401b on the package substrate may be transmitted to the first, second, third, and fourth semiconductor chips 410, 420, 430, and 440 through the first wire 451b, and one of output signals outputted from the first, second, third, or fourth semiconductor chip 410, 420, 430, or 440 may be transmitted to the first pad 401b on the package substrate through the first wire 451b. These connection configurations are equally applicable to the remaining first data I/O pads 411c, . . . and 411n, the remaining second data I/O pads 421c, . . . and 421n, the remaining third data I/O pads 431c, . . . and 431n, the remaining fourth data I/O pads 441c, . . . and 441n and the remaining first pads 401c, . . . and 401n on the package substrate. That is, the first data I/O pad 411n, the second data I/O pad 421n, the third data I/O pad 431n, the fourth data I/O pad 441n and the first pad 401n may also be electrically connected to each other through the first wire 451n.

First and second flag signals may be transmitted to the first semiconductor chip 410 through the first flag pads 412a and 412b, and the first and second flag signals may be transmitted to the second semiconductor chip 420 through the second flag pads 422a and 422b. Similarly, the first and second flag signals may be transmitted to the third semiconductor chip 430 through the third flag pads 432a and 432b, and the first and second flag signals may be transmitted to the fourth semiconductor chip 440 through the fourth flag pads 442a and 442b. Therefore, the first, second, third, and fourth flag pads 412a, 422a, 432a, and 442a may be electrically connected to the second pad 402a through a second wire 452a. That is, the first flag signal applied to the second pad 402a may be transmitted to the first, second, third, and fourth flag pads 412a, 422a, 432a, and 442a through the second wire 452a. Similarly, the first, second, third, and fourth flag pads 412b, 422b, 432b, and 442b may be electrically connected to the second pad 402b through a second wire 452b. That is, the second flag signal applied to the second pad 402b may be transmitted to the first, second, third, and fourth flag pads 412b, 422b, 432b, and 442b through the second wire 452b. The first and second flag signals may be transmitted to a buffer in each of the first to fourth semiconductor chips 410, 420, 430, and 440 and may be used as switching input signals that control switching operations of internal circuits included in the buffers.

The first, second, third, and fourth semiconductor chips 410, 420, 430, and 440 may include a first buffer, a second buffer, a third buffer, and a fourth buffer, respectively. Each of the first to fourth buffers may have a logic circuit. That is, the first and second flag signals may be applied to the logic circuit. Then, logic levels of output signals of the logic circuits included in the first, second, third, and fourth semiconductor chips 410, 420, 430, and 440 may be determined according to logic levels of the first and second flag signals. For example, if the first and second flag signals are applied to the input terminals of the logic circuits in the first, second, third, and fourth semiconductor chips 410, 420, 430, and 440, at least one of the buffers in the first, second, third, and fourth semiconductor chips 410, 420, 430, and 440 may be in a turned-on state, and the other buffers may be in turned-off state.

Figure 5:
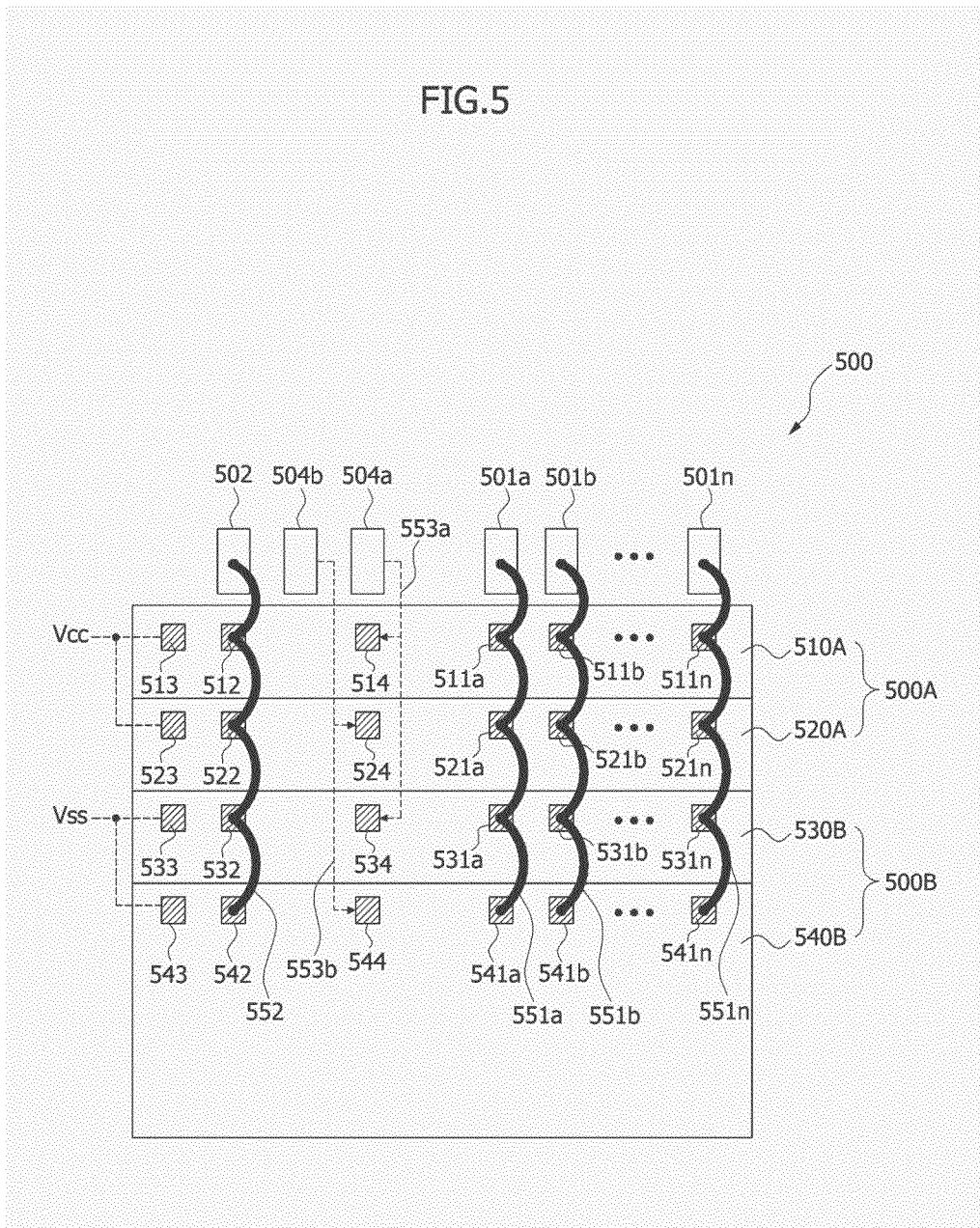
FIG. 5 is a plan view illustrating a double channel stack package according to still an embodiment.

FIG. 5 is a plan view illustrating a double channel stack package according to an embodiment. Referring to FIG. 5, semiconductor chips included in a stack package 500 according to an embodiment may be divided into two channel groups whereas all the semiconductor chips 110 and 120 of the stack package 100 shown in FIG. 1 or all the semiconductor chips 410, 420, 430, and 440 of the stack package 400 shown in FIG. 4 belong to a single channel group. The stack package 500 according to an embodiment may be configured to include a first semiconductor chip 510A, a second semiconductor chip 520A, a third semiconductor chip 530B, and a fourth semiconductor chip 540B which are sequentially stacked on a package substrate (not shown). In various embodiments, the first to fourth semiconductor chips 510A, 520A, 530B, and 540B may be stacked such that at least first edges of the first to fourth semiconductor chips 510A, 520A, 530B, and 540B exhibit a step shape. Electrical signals of the first to fourth semiconductor chips 510A, 520A, 530B, and 540B may be transmitted through a plurality of channels to improve the operation speed of the stack package 500. According to an embodiment, the first and second semiconductor chips 510A and 520A may communicate with each other through a first channel and the third and fourth semiconductor chips 530B and 540B may communicate with each other through a second channel. That is, the first and second semiconductor chips 510A and 520A may constitute a first channel group 500A, and the third and fourth semiconductor chips 530B and 540B may constitute a second channel group 500B. Although an embodiment is described in conjunction with an example that each of the first and second channel groups 500A and 500B includes two stacked semiconductor chips, these embodiments are merely examples of inventive concepts. That is, in various embodiments, each channel group may include three or more stacked semiconductor chips.

The package substrate may include a plurality of first pads 501a, 501b, ... and 501n, a second pad 502, and a pair of third pads 504a and 504b which are disposed on a surface thereof. The first and second semiconductor chips 510A and 520A constituting the first channel group 500A may receive or output I/O signals through the first pads 501a, 501b, ... and 501n. The third and fourth semiconductor chips 530B and 540B constituting the second channel group 500B may also receive or output the I/O signals through the first pads 501a, 501b, ... and 501n. The number of the first pads 501a, 501b, ... and 501n may be equal to the number of the I/O signals. The first and second semiconductor chips 510A and 520A constituting the first channel group 500A may receive a channel flag signal through the second pad 502. The third and fourth semiconductor chips 530B and 540B constituting the second channel group 500B may also receive the channel flag signal through the second pad 502. The first and second semiconductor chips 510A and 520A constituting the first channel group 500A may receive chip enable signals through the third pads 504a and 504b, and the third and fourth semiconductor chips 530B and 540B constituting the second channel group 500B may also receive the chip enable signals through the third pads 504a and 504b. The number of the third pads 504a and 504b may depend on the number of the semiconductor chips included in each channel group. In an embodiment, the number of the third pads 504a and 504b may be two because each of the first and second channel groups 500A and 500B has two semiconductor chips.

The first semiconductor chip 510A may include a plurality of first data I/O pads 511a, 511b, ... and 511n, a first channel flag pad 512, a first power supply pad 513 and a first chip enable pad 514. The second semiconductor chip 520A may include a plurality of second data I/O pads 521a, 521b, ... and 521n, a second channel flag pad 522, a second power supply pad 523 and a second chip enable pad 524. The third semiconductor chip 530B may include a plurality of third data I/O pads 531a, 531b, ... and 531n, a third channel flag pad 532, a third power supply pad 533 and a third chip enable pad 534. The fourth semiconductor chip 540B may include a plurality of fourth data I/O pads 541a, 541b, ... and 541n, a fourth channel flag pad 542, a fourth power supply pad 543 and a fourth chip enable pad 544. Further, although not shown in the drawings, the first to fourth semiconductor chips 510A, 520A, 530B, and 540B may include a first buffer, a second buffer, a third buffer, and a fourth buffer, respectively. The first, second, third, and fourth buffers may have substantially the same configuration.

The first, second, third, and fourth semiconductor chips 510A, 520A, 530B, and 540B may receive or output the I/O signals through the first data I/O pads 511a, 511b, ... and 511n, the second data I/O pads 521a, 521b, ... and 521n, the third data I/O pads 531a, 531b, ... and 531n, and the fourth data I/O pads 541a, 541b, ... and 541n, respectively. The first, second, third, and fourth data I/O pads 511a, 511b, ... , 511c, 521a, 521b, ... , 521n, 531a, 531b, ... , 531n, 541a, 541b, ... and 541n may be electrically connected to the first pads 501a, 501b, ... and 501n disposed on the package substrate through first wires 551a, 551b, ... and 551n.

Specifically, the first, second, third, and fourth data I/O pads 511a, 521a, 531a, and 541a may be electrically connected to the first pad 501a through the first wire 551a. Thus, an input signal applied to the first pad 501a on the package substrate may be transmitted to the first, second, third, and fourth semiconductor chips 510A, 520A, 530B, and 540B through the first wire 551a. On the contrary, one of output signals outputted from the first, second, third, or fourth semiconductor chip 510A, 520A, 530B, or 540B may be transmitted to the first pad 501a on the package substrate through the first wire 551a.

Similarly, the first, second, third, and fourth data I/O pads 511b, 521b, 531b, and 541b may be electrically connected to the first pad 501b through the first wire 551b. Thus, an input signal applied to the first pad 501b on the package substrate may be transmitted to the first, second, third, and fourth semiconductor chips 510A, 520A, 530B, and 540B through the first wire 551b. On the contrary, one of output signals outputted from the first, second, third or fourth semiconductor chip 510A, 520A, 530B, or 540B may be transmitted to the first pad 501b on the package substrate through the first wire 551b.

Further, the first, second, third, and fourth data I/O pads 511n, 521n, 531n and 541n may be electrically connected to the first pad 501n through the first wire 551n. Thus, an input signal applied to the first pad 501n on the package substrate may be transmitted to the first, second, third, and fourth semiconductor chips 510A, 520A, 530B, and 540B through the first wire 551n. On the contrary, one of output signals outputted from the first, second, third, or fourth semiconductor chip 510A, 520A, 530B, or 540B may be transmitted to the first pad 501n on the package substrate through the first wire 551n.

The first semiconductor chip 510A may receive a channel flag signal through the first channel flag pad 512, and the second semiconductor chip 520A may receive the channel flag signal through the second channel flag pad 522. Similarly, the third semiconductor chip 530B may receive the channel flag signal through the third channel flag pad 532, and the fourth semiconductor chip 540B may receive the channel flag signal through the fourth channel flag pad 542. Therefore, the first, second, third, and fourth channel flag pads 512, 522, 532, and 542 may be electrically connected to the second pad 502 on the package substrate through a second wire 552.

The first, second, third, and fourth power supply pads 513, 523, 533, and 543 may correspond to input pads for applying power voltage signals to the first, second, third, and fourth semiconductor chips 510A, 520A, 530B, and 540B, respectively. In various embodiments, a first power voltage signal Vcc having a first logic level, for example, a logic "high" level may be applied to both the first and second power supply pads 513 and 523 of the first and second semiconductor chips 510A and 520A constituting the first channel group 500A, and a second power voltage signal Vss having a second logic level, for example, a logic "low" level may be applied to both the third and fourth power supply pads 533 and 543 of the third and fourth semiconductor chips 530A and 540A constituting the second channel group 500B. In any case, the first and second power voltage signals Vcc and Vss may have different logic levels from each other. In an embodiment, the first power voltage signal Vcc may have a logic "high" level and the second power voltage signal Vss may have a logic "low" level.

The first, second, third, and fourth chip enable pads 514, 524, 534, and 544 may correspond to input pads for applying the chip enable signals to the first, second, third, and fourth semiconductor chips 510A, 520A, 530B, and 540B, respectively. The chip enable pads 514 and 524 of the first and second semiconductor chips 510A and 520A constituting the first channel group 500A may be electrically connected to respective ones of the chip enable pads 534 and 544 of the third and fourth semiconductor chips 530B and 540B constituting the second channel group 500B. For example, the first chip enable pad 514 of the first semiconductor chip 510A in the first channel group 500A and the third chip enable pad 534 of the third semiconductor chip 530B in the second channel group 500B may be electrically connected to the third pad 504a on the package substrate through a first interconnection line 553a. Similarly, the second chip enable pad 524 of the second semiconductor chip 520A in the first channel group 500A and the fourth chip enable pad 544 of the fourth semiconductor chip 540B in the second channel group 500B may be electrically connected to the third pad 504b on the package substrate through a second interconnection line 553b. The first and second interconnection lines 553a and 553b may include conductive lines disposed in the package substrate, but not limited thereto.

If a first chip enable signal is applied to the third pad 504a, the first chip enable signal may be transmitted to both the first semiconductor chip 510A in the first channel group 500A and the third semiconductor chip 530B in the second channel group 500B. In addition, if a second chip enable signal is applied to the third pad 504b, the second chip enable signal may be transmitted to both the second semiconductor chip 520A in the first channel group 500A and the fourth semiconductor chip 540B in the second channel group 500B. In various embodiments, the first and second chip enable signals may be sequentially applied to the semiconductor chips. That is, the first and second chip enable signals may not be simultaneously applied to the pair of third pads 504a and 504b for a predetermined duration. Alternatively, the first and second chip enable signals may be simultaneously applied to the pair of third pads 504a and 504b. In such a case, the first and second chip enable signals may have different logic levels from each other. For example, the first chip enable signal having a logic "high" level and the second chip enable signal having a logic "low" level may be simultaneously applied to the pair of third pads 504a and 504b, or the first chip enable signal having a logic "low" level and the second chip enable signal having a logic "high" level may be simultaneously applied to the pair of third pads 504a and 504b.

Figure 6:
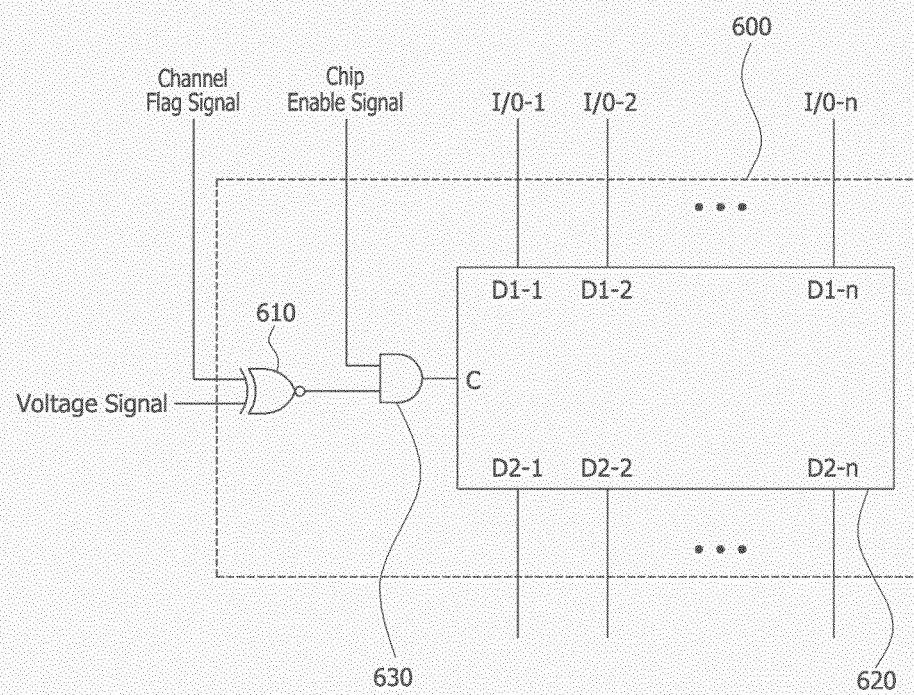
FIG. 6 is a schematic view illustrating an example of a buffer of a semiconductor chip included in a double channel stack package shown in FIG. 5.

FIG. 6 is a schematic view illustrating an example of a buffer of a semiconductor chip included in the double channel stack package shown in FIG. 5. Referring to FIGS. 5 and 6, a buffer 600 of any one of the semiconductor chips in the double channel stack package 500 may be configured to include an exclusive NOR gate 610, a switching portion 620, and an AND gate 630. The channel flag signal and a voltage signal may be applied to respective ones of input terminals of the exclusive NOR gate 610. The channel flag signal may be applied to all the semiconductor chips 510A, 520A, 530B, and 540B regardless of the channel groups 500A and 500B. Thus, the channel flag signal having a logic "high" level or a logic "low" level may be simultaneously transmitted to all the first to fourth semiconductor chips 510A, 520A, 530B, and 540B included in the first and second channel groups 500A and 50B. The voltage signal applied to the first channel group 500A may have a different logic level from the voltage signal applied to the second channel group 500B. That is, the first power voltage signal Vcc having a logic "high" level may be transmitted to the first and second semiconductor chips 510A and 520A of the first channel group 500A, and the second power voltage signal Vss having a logic "low" level may be transmitted to the third and fourth semiconductor chips 530B and 540B of the second channel group 500B. Thus, in the event that the channel flag signal applied to the second pad 502 has a logic "high" level, the exclusive NOR gates 610 of the first and second semiconductor chips 510A and 520A in the first channel group 500A may generate output signals having a logic "high" level and the exclusive NOR gates 610 of the third and fourth semiconductor chips 530B and 540B in the second channel group 500B may generate output signals having a logic "low" level. On the contrary, in the event that the channel flag signal applied to the second pad 502 has a logic "low" level, the exclusive NOR gates 610 of the first and second semiconductor chips 510A and 520A in the first channel group 500A may generate output signals having a logic "high" level and the exclusive NOR gates 610 of the third and fourth semiconductor chips 530B and 540B in the second channel group 500B may generate output signals having a logic "low" level. Therefore, when the channel flag signal having a logic "high" level or a logic "low" level is applied to the second pad 502, the output signals outputted from the exclusive NOR gates 610 in the first channel group 500A may have a different logic level from the output signals outputted from the exclusive NOR gates 610 in the second channel group 500B.

The AND gate 630 may generate an output signal in response to the output signal of the exclusive NOR gate 610 and one of the chip enable signals applied to the third pads 504a and 504b, and the output signal of the AND gate 630 may be applied to an input terminal of the switching portion 620. In order that the AND gate 630 generates an output signal having a logic "high" level, both the input signals of the AND gate 630 should have logic "high" levels. That is, when the output signal of the exclusive NOR gate 610 and the chip enable signal applied to the AND gate 630 have logic "high" levels, the AND gate 630 may generate an output signal having a logic "high" level. Accordingly, when the channel flag signal has a logic "high" level, a high level signal may be applied to one of the input terminals of each of the AND gates 630 in the first channel group 500A and a low level signal may be applied to one of the input terminals of each of the AND gates 630 in the second channel group 500B. Alternatively, when the channel flag signal has a logic "low" level, a low level signal may be applied to one of the input terminals of each of the AND gates 630 in the first channel group 500A and a high level signal may be applied to one of the input terminals of each of the AND gates 630 in the second channel group 500B.

When the channel flag signal has a logic "high" level, logic levels of the output signals of the AND gates 630 in the first channel group 500A may depend on logic levels of the chip enable signals applied to the third pads 504a and 504b. However, when the channel flag signal has a logic "high" level, logic levels of the output signals of the AND gates 630 in the second channel group 500B may have logic "low" levels regardless of the logic levels of the chip enable signals applied to the third pads 504a and 504b. This is because a low level signal is applied to one of the input terminals of each of the AND gates 630 in the second channel group 500B when the channel flag signal has a logic "high" level, as described above. In various embodiments, the first chip enable signal applied to the third pad 504a and the second chip enable signal applied to the third pad 504b may have different logic levels from each other, as described above. In such a case, the chip enable signals transmitted to respective ones of the first and second semiconductor chips 510A and 520A in the first channel group 500A may have different logic levels from each other. Thus, one of the AND gates 630 of the first and second semiconductor chips 510A and 520A may generate an output signal having a logic "high" level, and the other AND gate 630 may generate an output signal having a logic "low" level.

The output terminal of the AND gate 630 may be electrically connected to a control input terminal C of the switching portion 620. Thus, the output signal of the AND gate 630 may be transmitted to the switching portion 620 through the control input terminal C. The switching portion 620 may include a plurality of first data I/O terminals D1-1, D1-2, . . . and D1-n and a plurality of second data I/O terminals D2-1, D2-2, . . . and D2-n. The first data I/O terminals D1-1, D1-2, . . . and D1-n may be electrically connected to respective ones of the first data I/O pads of the corresponding semiconductor chip 510A, 520A, 530B, or 540B, and the second data I/O terminals D2-1, D2-2, . . . and D2-n may be electrically connected to a main circuit portion of the corresponding semiconductor chip. The main circuit portion of the corresponding semiconductor chip may execute main functions of the corresponding semiconductor chip. For example, when the corresponding semiconductor chip is a flash memory chip, the main circuit portion may include address decoders and sense amplifiers for driving and controlling flash memory cells, and I/O buffers. The switching portion 620 may control a switching operation between the first data I/O terminals D1-1, D1-2, . . . and D1-n and the second data I/O terminals D2-1, D2-2, . . . and D2-n in response to the output signal of the AND gate 630 (e.g., an input signal applied to the control input terminal C of the switching portion 620). The switching portion 620 may have substantially the same configuration and switching operation as the switching portion 220 described with reference to FIG. 3. Thus, detailed descriptions to the configuration and switching operation of the switching portion 620 will be omitted in these embodiments to avoid duplicate explanations.

Hereinafter, operations of the stack package 500 according to an embodiment will be described in conjunction with only the first semiconductor chip 510A of the first channel group 500A. First, data I/O signals I/O-1, I/O-2, . . . and I/O-n may be transmitted to the stack package 500 through the first pads 501a, 501b, . . . and 501n, and a channel flag signal having a logic "high" level may be transmitted to the stack package 500 through the second pad 502. Further, a first chip enable signal having a logic "high" level and a second chip enable signal having a logic "low" level may be transmitted to the stack package 500 through the third pad 504a and the third pad 504b, respectively. This signal transmission may be executed by an external controller disposed outside the stack package 500 or an internal controller disposed inside the stack package 500. In various embodiments, the channel flag signal, the chip enable signals, and the data I/O signals may be sequentially processed or inputted by an extra clock signal, but not limited thereto. For example, the processing sequence of the channel flag signal, the chip enable signals and the data I/O signals may be changed according to a design scheme.

The data I/O signals I/O-1, I/O-2, . . . and I/O-n applied to the first pads 501a, 501b, . . . and 501n may be transmitted to the first data I/O pads 511a, 511b, . . . and 511n of the first semiconductor chip 510A, the second data I/O pads 521a, 521b, . . . and 521n of the second semiconductor chip 520A, the third data I/O pads 531a, 531b, . . . and 531n of the third semiconductor chip 530B, and the fourth data I/O pads 541a, 541b, . . . and 541n of the fourth semiconductor chip 540B through the first wires 551a, 551b, . . . and 551n regardless of the channel configuration of the stack package 500. Although the data I/O signals I/O-1, I/O-2, . . . and I/O-n are transmitted to all the first, second, third, and fourth data I/O pads of the first, second, third, and fourth semiconductor chips 510A, 520A, 530B and 540B regardless of the channel configuration of the stack package 500, the data I/O signals I/O-1, I/O-2, . . . and I/O-n may be selectively transmitted to only one of the main circuit portions of the first, second, third, and fourth semiconductor chips 510A, 520A, 530B, and 540B according to a combination of the channel flag signal, the first and second chip enable signals, and the first and second power voltage signals Vcc and Vss, as described more fully hereinafter. For example, according to a combination of the channel flag signal, the first and second chip enable signals, and the first and second power voltage signals Vcc and Vss, the data I/O signals I/O-1, I/O-2, . . . and I/O-n may be selectively transmitted to only the main circuit portion of the first semiconductor chip 510A and may not be transmitted to the main circuit portions of the remaining semiconductor chips.

The channel flag signal (having a logic "high" level) applied to the second pad 502 on the package substrate may be transmitted to all the first to fourth semiconductor chips 510A, 520A, 530B, and 540B included in both the first and second channel groups 500A and 500B. Thus, the exclusive NOR gates 610 in the first channel group 500A may generate output signals having logic "high" levels, and the logic levels of the output signals of the AND gates 630 in the first channel group 500A may depend on the logic levels of the first and second chip enable signals applied to the third pads 504a and 504b. However, even though the channel flag signal has a logic "high" level, the exclusive NOR gates 610 in the second channel group 500B may generate output signals having logic "low" levels. Thus, the AND gates 630 in the second channel group 500B may generate output signals having logic "low" levels regardless of the logic levels of the first and second chip enable signals. Accordingly, all the switching portions 620 in the second channel group 500B are in turned-off states. As a result, the data I/O signals I/O-1, I/O-2, . . . and I/O-n may not be transmitted to the main circuits of the third and fourth semiconductor chips 530B and 540B, and the data I/O signals I/O-1, I/O-2, . . . and I/O-n generated from the third and fourth semiconductor chips 530B and 540B may not be transmitted to the first pads 501a, 501b, . . . and 501n on the package substrate.

The first chip enable signal (having a logic "high" level) applied to the third pad 504a on the package substrate may be transmitted to one of the input terminals of the AND gate 630 of the first semiconductor chip 510A in the first channel group 500A and one of the input terminals of the AND gate 630 of the third semiconductor chip 530B in the second channel group 500B. Further, the second chip enable signal (having a logic "low" level) applied to the third pad 504b on the package substrate may be transmitted to one of the input terminals of the AND gate 630 of the second semiconductor chip 520A in the first channel group 500A and one of the input terminals of the AND gate 630 of the fourth semiconductor chip 540B in the second channel group 500B. In such a case, the AND gate 630 of the first semiconductor chip 510A in the first channel group 500A may generate an output signal having a logic "high" or "low" level according to the logic level of the output signal of the exclusive NOR gate 610 of the first semiconductor chip 510A, and the AND gate 630 of the third semiconductor chip 530B in the second channel group 500B may generate an output signal having a logic "high" or "low" level according to the logic level of the output signal of the exclusive NOR gate 610 of the third semiconductor chip 510A. However, the AND gates 630 of the second and fourth semiconductor chips 520A and 540B may generate output signals having logic "low" levels regardless of the logic levels of the output signals of the exclusive NOR gates 610 of the second and fourth semiconductor chips 520A and 540B because the second chip enable signal having a logic "low" level is applied to one of the input terminals of each of the AND gates 630 disposed in the second and fourth semiconductor chips 520A and 540B. Thus, the data I/O signals I/O-1, I/O-2, . . . and I/O-n may not be transmitted to the main circuits of the second and fourth semiconductor chips 520A and 540B, and the data I/O signals I/O-1, I/O-2, . . . and I/O-n generated from the second and fourth semiconductor chips 520A and 540B may not be transmitted to the first pads 501a, 501b, . . . and 501n on the package substrate.

As described above, if the channel flag signal having a logic "high" level, the first chip enable signal having a logic "high" level and the second chip enable signal having a logic "low" level are applied to the stack package 500, the exclusive NOR gate 610 of the first semiconductor chip 510A in the first channel group 500A may generate an output signal having a logic "high" level in response to the channel flag signal having a logic "high" level and the first power voltage signal Vcc having a logic "high" level. Thus, the AND gate 630 of the first semiconductor chip 510A may generate an output signal having a logic "high" level in response to the first chip enable signal having a logic "high" level and the output signal (having a logic "high" level) of the exclusive NOR gate 610. As a result, the switching portion 620 of the first semiconductor chip 510A may be in a turned-on state. Therefore, the data I/O signals I/O-1, I/O-2, . . . and I/O-n may be transmitted to the main circuit of the first semiconductor chips 510A, or the data I/O signals I/O-1, I/O-2, . . . and I/O-n generated from the first semiconductor chip 510A may be transmitted to the first pads 501a, 501b, . . . and 501n on the package substrate.

Further, if the channel flag signal having a logic "high" level, the first chip enable signal having a logic "high" level and the second chip enable signal having a logic "low" level are applied to the stack package 500, the exclusive NOR gate 610 of the second semiconductor chip 520A in the first channel group 500A may generate an output signal having a logic "high" level in response to the channel flag signal having a logic "high" level and the first power voltage signal Vcc having a logic "high" level. Thus, the AND gate 630 of the second semiconductor chip 520A may generate an output signal having a logic "low" level in response to the second chip enable signal having a logic "low" level regardless of the logic level of the output signal of the exclusive NOR gate 610. As a result, the switching portion 620 of the second semiconductor chip 520A may be in a turned-off state.

In addition, if the channel flag signal having a logic "high" level, the first chip enable signal having a logic "high" level and the second chip enable signal having a logic "low" level are applied to the stack package 500, the exclusive NOR gate 610 of the third semiconductor chip 530B in the second channel group 500B may generate an output signal having a logic "low" level in response to the channel flag signal having a logic "high" level and the second power voltage signal Vss having a logic "low" level. Thus, the AND gate 630 of the third semiconductor chip 530B may generate an output signal having a logic "low" level in response to the output signal (having a logic "low" level) of the exclusive NOR gate 610 regardless of the logic level of the first chip enable signal. As a result, the switching portion 620 of the third semiconductor chip 530B may be in a turned-off state.

Moreover, if the channel flag signal having a logic "high" level, the first chip enable signal having a logic "high" level and the second chip enable signal having a logic "low" level are applied to the stack package 500, the exclusive NOR gate 610 of the fourth semiconductor chip 540B in the second channel group 500B may generate an output signal having a logic "low" level in response to the channel flag signal having a logic "high" level and the second power voltage signal Vss having a logic "low" level. Thus, the AND gate 630 of the fourth semiconductor chip 540B may generate an output signal having a logic "low" level in response to the output signal (having a logic "low" level) of the exclusive NOR gate 610 regardless of the logic level of the second chip enable signal.

As a result, the switching portion 620 of the fourth semiconductor chip 540B may be in a turned-off state.

According to the above embodiments, one of the semiconductor chips in the first and second channel groups may be selected using chip enable signals. However, the embodiments of the inventive concept are not limited thereto. That is, in various embodiments, one of the semiconductor chips in the first and second channel groups may be selected even without use of the chip enable signals.

Figure 7:
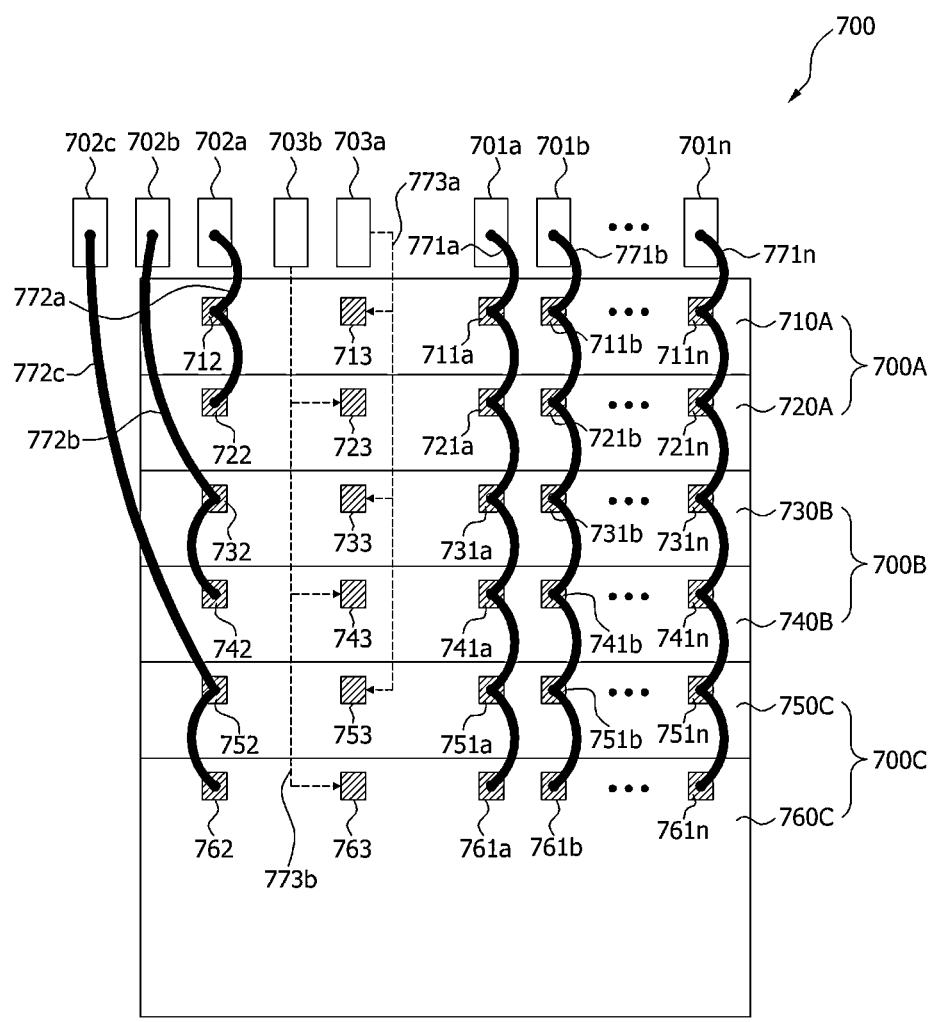
FIG. 7 is a plan view illustrating a multi channel stack package according to an embodiment.

FIG. 7 is a plan view illustrating a multi channel stack package according to an embodiment. Referring to FIG. 7, a stack package 700 according to an embodiment may be configured to include a plurality of semiconductor chips which are divided into a plurality of channel groups, particularly, at least three channel groups. Specifically, the stack package 700 may include a first semiconductor chip 710A, a second semiconductor chip 720A, a third semiconductor chip 730B, a fourth semiconductor chip 740B, a fifth semiconductor chip 750C, and a sixth semiconductor chip 760C which are sequentially stacked on a package substrate (not shown). The first and second semiconductor chips 710A and 720A may constitute a first channel group 700A, the third and fourth semiconductor chips 730B and 740B may constitute a second channel group 700B, and the fifth and sixth semiconductor chips 750C and 760C may constitute a third channel group 700C. In various embodiments, the first to sixth semiconductor chips 710A, 720A, 730B, 740B, 750C, and 760C may be sequentially stacked such that at least first edges of the first to sixth semiconductor chips 710A, 720A, 730B, 740B, 750C, and 760C exhibit a step shape. Alternatively, the first and second semiconductor chips 710A and 720A in the first channel group 700A, the third and fourth semiconductor chips 730B and 740B in the second channel group 700B, and the fifth and sixth semiconductor chips 750C and 760C in the third channel group 700C may be stacked on three different places of the package substrate, respectively. Electrical signals of the first to third channel groups 700A, 700B, and 700C may be transmitted through three channels to improve the operation speed of the stack package 700. According to an embodiment, the first and second semiconductor chips 710A and 720A in the first channel group 700A may communicate with each other through a first channel, the third and fourth semiconductor chips 730B and 740B in the second channel group 700B may communicate with each other through a second channel, and the fifth and sixth semiconductor chips 750C and 760C in the third channel group 700C may communicate with each other through a third channel. Although the embodiments are described in conjunction with an example that each of the first, second, and third channel groups 700A, 700B, and 700C include two stacked semiconductor chips, these embodiments are merely an example of the inventive concepts. That is, in various embodiments, each channel group may include three or more stacked semiconductor chips.

The package substrate may include a plurality of first pads 701a, 701b, . . . and 701n, a plurality of second pads 702a, 702b and 702c, and a pair of third pads 703a and 703b which are disposed on a surface thereof. The first pads 701a, 701b, . . . and 701n may be data I/O pads for receiving input data signals from external devices or outputting output data signals generated from the first, second, or third channel groups 700A, 700B, or 700C. The number of the first pads 701a, 701b, . . . and 701n may be equal to the number of the data I/O signals (also, referred to as I/O signals). The second pads 702a, 702b, and 702c may be input pads for transmitting channel flag signals to the first and second semiconductor chips 710A and 720A in the first channel group 700A, the third and fourth semiconductor chips 730B and 740B in the second channel group 700B, and the fifth and sixth semiconductor chips 750C and 760C in the third channel group 700C. The number of the second pads 702a, 702b, and 702c may correspond to the number of the channel groups. The third pads 703a and 703b may be input pads for transmitting chip enable signals to the first and second semiconductor chips 710A and 720A in the first channel group 700A, the third and fourth semiconductor chips 730B, and 740B in the second channel group 700B, and the fifth and sixth semiconductor chips 750C and 760C in the third channel group 700C. The number of the third pads 703a and 703b may correspond to the number of the semiconductor chips included in each channel group. According to an embodiment, each channel group may include two semiconductor chips. Thus, the number of the third pads may be two.

The first semiconductor chip 710A may include a plurality of first data I/O pads 711a, 711b, . . . and 711n, a first channel flag pad 712 and a first chip enable pad 713. The second semiconductor chip 720A may include a plurality of second data I/O pads 721a, 721b, . . . and 721n, a second channel flag pad 722 and a second chip enable pad 723. The third semiconductor chip 730B may include a plurality of third data I/O pads 731a, 731b, . . . and 731n, a third channel flag pad 732 and a third chip enable pad 733. The fourth semiconductor chip 740B may include a plurality of fourth data I/O pads 741a, 741b, . . . and 741n, a fourth channel flag pad 742 and a fourth chip enable pad 743. The fifth semiconductor chip 750C may include a plurality of fifth data I/O pads 751a, 751b, . . . and 751n, a fifth channel flag pad 752 and a fifth chip enable pad 753. The sixth semiconductor chip 760C may include a plurality of sixth data I/O pads 761a, 761b, . . . and 761n, a sixth channel flag pad 762 and a sixth chip enable pad 763. Further, although not shown in the drawings, the first to sixth semiconductor chips 710A, 720A, 730B, 740B, 750C, and 760C may include first to sixth buffers, respectively. The first to sixth buffers may have substantially the same configuration.

The first, second, third, fourth, fifth, and sixth semiconductor chips 710A, 720A, 730B, 740B, 750C, and 760C may receive or output the I/O signals through the first data I/O pads 711a, 711b, . . . and 711n, the second data I/O pads 721a, 721b, . . . and 721n, the third data I/O pads 731a, 731b, . . . and 731n, the fourth data I/O pads 741a, 741b, . . . and 741n, the fifth data I/O pads 751a, 751b, . . . and 751n, and the sixth data I/O pads 761a, 761b, . . . and 761n, respectively. The first, second, third, fourth, fifth, and sixth data I/O pads 711a, 711b, . . . and 711n, 721a, 721b, . . . and 721n, 731a, 731b, . . . and 731n, 741a, 741b, . . . and 741n, 751a, 751b, . . . and 751n, and 761a, 761b, . . . and 761n may be electrically connected to the first pads 701a, 701b, . . . and 701n on the package substrate through first wires 771a, 771b, . . . and 771n.

Specifically, the first, second, third, fourth, fifth, and sixth data I/O pads 711a, 721a, 731a, 741a, 751a, and 761a, and the first pad 701a may be electrically connected to each other through the first wire 771a. Thus, an input signal applied to the first pad 701a on the package substrate may be transmitted to the first, second, third, fourth, fifth, and sixth semiconductor chips 710A, 720A, 730B, 740B, 750C, and 760C through the first wire 771a. On the contrary, one of output signals outputted from the first, second, third, fourth, fifth, or sixth semiconductor chip 710A, 720A, 730B, 740B, 750C, or 760C may be transmitted to the first pad 701a on the package substrate through the first wire 771a.

Further, the first, second, third, fourth, fifth, and sixth data I/O pads 711b, 721b, 731b, 741b, 751b, and 761b, and the first pad 701b may be electrically connected to each other through the first wire 771b. Thus, an input signal applied to the first pad 701b on the package substrate may be transmitted to the first, second, third, fourth, fifth, and sixth semiconductor chips 710A, 720A, 730B, 740B, 750C, and 760C through the first wire 771b. On the contrary, one of output signals outputted from the first, second, third, fourth, fifth, or sixth semiconductor chip 710A, 720A, 730B, 740B, 750C, or 760C may be transmitted to the first pad 701b on the package substrate through the first wire 771b.

Similarly, the first, second, third, fourth, fifth, and sixth data I/O pads 711n, 721n, 731n, 741n, 751n, and 761n, and the first pad 701n may be electrically connected to each other through the first wire 771n. Thus, an input signal applied to the first pad 701n on the package substrate may be transmitted to the first, second, third, fourth, fifth, and sixth semiconductor chips 710A, 720A, 730B, 740B, 750C, and 760C through the first wire 771n. On the contrary, one of output signals outputted from the first, second, third, fourth, fifth, or sixth semiconductor chip 710A, 720A, 730B, 740B, 750C, or 760C may be transmitted to the first pad 701n on the package substrate through the first wire 771n.

The first to sixth channel flag pads 712, 722, 732, 742, 752, and 762 may be input pads for transmitting the channel flag signals applied to the second pads 702a, 702b, and 702c to the first to sixth semiconductor chips 710A, 720A, 730B, 740B, 750C, and 760C. The first and second channel flag pads 712 and 722 in the first channel group 700A may be electrically connected to the second pad 702a on the package substrate through a second wire 772a. The third and fourth channel flag pads 732 and 742 in the second channel group 700B may be electrically connected to the second pad 702b on the package substrate through a second wire 772b. The fifth and sixth channel flag pads 752 and 762 in the third channel group 700C may be electrically connected to the second pad 702c on the package substrate through a second wire 772c.

Under the above connection configuration, a first channel flag signal applied to the second pad 702a on the package substrate may be transmitted to both the first and second semiconductor chips 710A and 720A in the first channel group 700A, a second channel flag signal applied to the second pad 702b on the package substrate may be transmitted to both the third and fourth semiconductor chips 730B and 740B in the second channel group 700B. Similarly, a third channel flag signal applied to the second pad 702c on the package substrate may be transmitted to both the fifth and sixth semiconductor chips 750C and 760C in the third channel group 700C. In various embodiments, the first, second, and third flag signals may be independently and selectively applied to the second pads 702a, 702b, and 702c, respectively. That is, only one of the first, second and third flag signals may be selectively applied for a predetermined duration. For example, while one of the first, second, and third flag signals is applied, the others may not be applied. Alternatively, the first, second, and third flag signals may be simultaneously applied to the second pads 702a, 702b and 702c, respectively. In such a case, one of the first, second, and third flag signals may have a logic "high" level and the others may have logic "low" levels.

The first to sixth chip enable pads 713, 723, 733, 743, 753, and 763 may be input pads for transmitting the chip enable signals applied to the third pads 703a and 703b to the first to sixth semiconductor chips 710A, 720A, 730B, 740B, 750C, and 760C. The chip enable pads in one of the first channel group 700A are electrically connected to respective ones of the chip enable pads in the second channel group 700B and respective ones of the chip enable pads in the third channel group 700C. For example, the first chip enable pad 713 of the first semiconductor chip 710A in the first channel group 700A, the third chip enable pad 733 of the third semiconductor chip 730B in the second channel group 700B, and the fifth chip enable pad 753 of the fifth semiconductor chip 750C in the third channel group 700C may be electrically connected to the third pad 703a on the package substrate through a first interconnection line 773a. Similarly, the second chip enable pad 723 of the second semiconductor chip 720A in the first channel group 700A, the fourth chip enable pad 743 of the fourth semiconductor chip 740B in the second channel group 700B, and the sixth chip enable pad 763 of the sixth semiconductor chip 760C in the third channel group 700C may be electrically connected to the third pad 703b on the package substrate through a second interconnection line 773b. The first and second interconnection lines 773a and 773b may include conductive lines disposed in the package substrate, but not limited thereto.

Under the above connection configuration, a first chip enable signal applied to the third pad 703a on the package substrate may be transmitted to all the first semiconductor chip 710A in the first channel group 700A, the third semiconductor chip 730B in the second channel group 700B, and the fifth semiconductor chip 750C in the third channel group 700C. Similarly, a second chip enable signal applied to the third pad 703b on the package substrate may be transmitted to all the second semiconductor chip 720A in the first channel group 700A, the fourth semiconductor chip 740B in the second channel group 700B, and the sixth semiconductor chip 760C in the third channel group 700C. In various embodiments, the first and second chip enable signals may be independently and selectively applied to the third pads 703a and 703b, respectively. That is, only one of the first and second chip enable signals may be selectively applied for a predetermined duration. For example, while one of the first and second chip enable signals is applied, the other chip enable signal may not be applied. Alternatively, the first and second chip enable signals may be simultaneously applied to the third pads 703a and 703b, respectively. In such a case, one of the first and second chip enable signals may have a logic "high" level and the other chip enable signal may have a logic "low" level.

Figure 8:
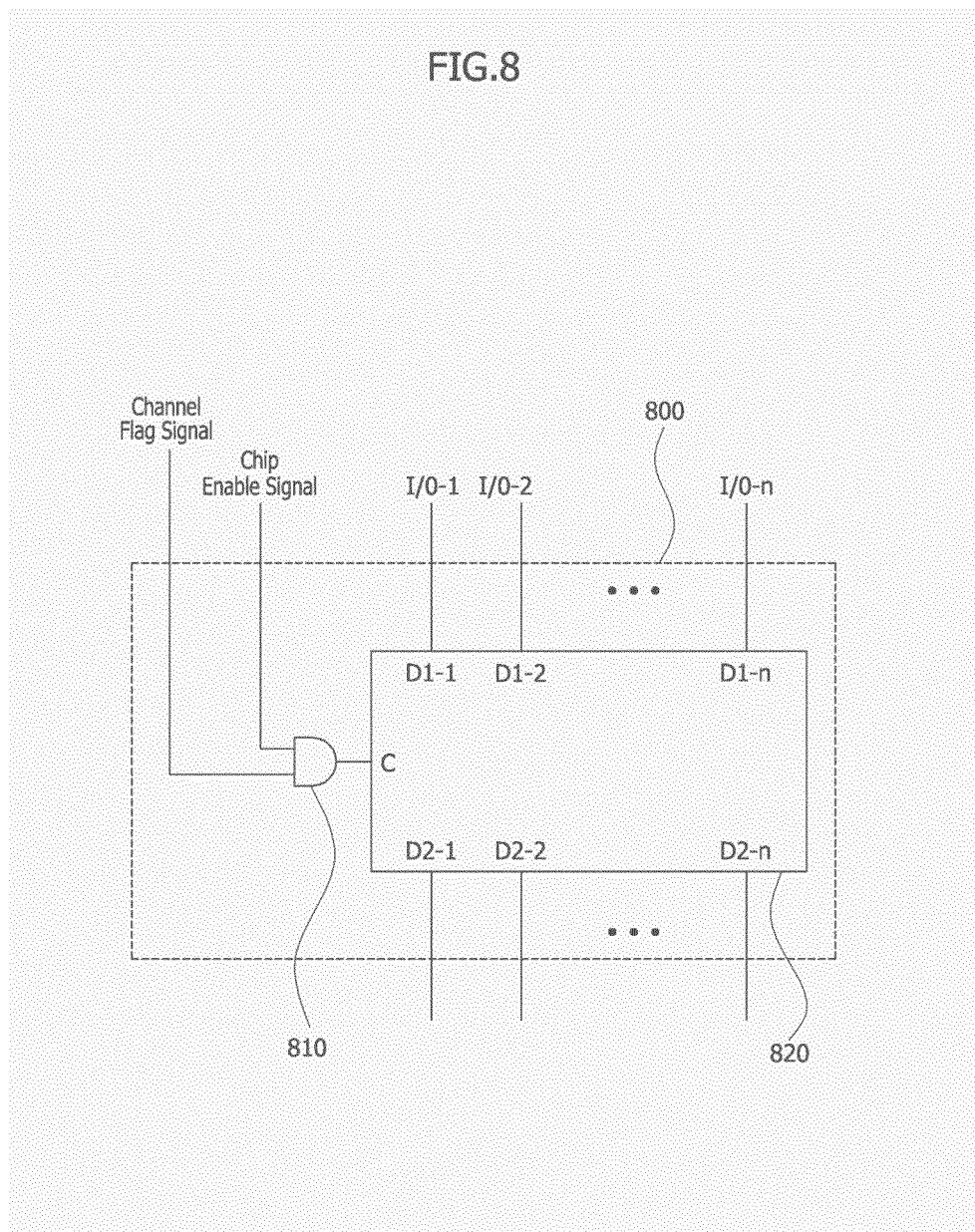
FIG. 8 is a schematic view illustrating an example of a buffer of a semiconductor chip included in a multi channel stack package shown in FIG. 7.

FIG. 8 is a schematic view illustrating an example of a buffer of a semiconductor chip included in a multi channel stack package shown in FIG. 7. Referring to FIGS. 7 and 8, a buffer 800 of any one of the semiconductor chips in the stack package 700 may be configured to include an AND gate 810 and a switching portion 820. One of the channel flag signals and one of the chip enable signals may be applied to respective ones of input terminals of the AND gate 810. The channel flag signals may be applied to respective ones of the channel groups. That is, the first channel flag signal may be applied to the first and second semiconductor chips 710A and 720A in the first channel group 700A, the second channel flag signal may be applied to the third and fourth semiconductor chips 730B and 740B in the second channel group 700B, and the third channel flag signal may be applied to the fifth and sixth semiconductor chips 750C and 760C in the third channel group 700C. One of the first, second, and third channel flag signals may have a different logic level from the other channel flag signals. For example, when the first channel flag signal has a logic "high" level, the second and third channel flag signals may have a logic "low" level. Alternatively, when the second channel flag signal has a logic "high" level, the first and third channel flag signals may have a logic "low" level.

Still alternatively, when the third channel flag signal has a logic "high" level, the first and second channel flag signals may have a logic "low" level.

The AND gate 810 may generate an output signal in response to one of the channel flag signals and one of the chip enable signals, and the output signal of the AND gate 810 may be applied to an input terminal of the switching portion 820. In the event that the first channel flag signal has a logic "high" level and the second and third channel flag signals have logic "low" levels, logic levels of output signals from the AND gates 810 of the first and second semiconductor chips 710A and 720A in the first channel group 700A may depend on the chip enable signals applied to the third pads 703a and 703b. That is, only one of the AND gates 810 of the first and second semiconductor chips 710A and 720A may have two input terminals to which the chip enable signal and the channel flag signal having logic "high" levels are applied. Thus, only one of the AND gates 810 of the first and second semiconductor chips 710A and 720A may generate an output signal having logic "high" level, and only one of the switching portions 820 of the first and second semiconductor chips 710A and 720A may be turned-on by the high-level output signal of the AND gate 810. Additionally, the second and third channel flag signals having logic "low" levels are applied to the input terminals of all the AND gates 810 in the second and third channels 700B and 700C, respectively. Thus, all the switching portions 830 of the third to sixth semiconductor chips 730B, 740B, 750C, and 760C in the second and third channel groups 700B and 700C may be turned off regardless of the logic levels of the chip enable signals. These logic operations for selecting any one of the semiconductor chips in all the channel groups are equally applicable to both the cases that only the second channel flag signal has a logic "high" level and only the third channel flag signal has a logic "high" level.

The output terminal of the AND gate 810 may be electrically connected to a control input terminal C of the switching portion 820. Thus, the output signal of the AND gate 810 may be transmitted to the switching portion 820 through the control input terminal C. The switching portion 820 may include a plurality of first data I/O terminals D1-1, D1-2, . . . and D1-n and a plurality of second data I/O terminals D2-1, D2-2, . . . and D2-n. The first data I/O terminals D1-1, D1-2, . . . and D1-n may be electrically connected to respective ones of the first data I/O pads of the corresponding semiconductor chip 710A, 720A, 730B, 740B, 750C, or 760C, and the second data I/O terminals D2-1, D2-2, . . . and D2-n may be electrically connected to a main circuit portion of the corresponding semiconductor chip. The main circuit portion of the semiconductor chip may execute main functions of the semiconductor chip. For example, when the corresponding semiconductor chip is a flash memory chip, the main circuit portion may include address decoders and sense amplifiers for driving and controlling flash memory cells, and I/O buffers. The switching portion 820 may control a switching operation between the first data I/O terminals D1-1, D1-2, . . . and D1-n and the second data I/O terminals D2-1, D2-2, . . . and D2-n in response to the output signal of the AND gate 810 (e.g., an input signal applied to the control input terminal C of the switching portion 820). The switching portion 820 may have substantially the same configuration and switching operation as the switching portion 220 described with reference to FIG. 3. Thus, detailed descriptions to the configuration and switching operation of the switching portion 820 will be omitted in this embodiment to avoid duplicate explanation.

Hereinafter, operations of the stack package 700 according to an embodiment will be described in conjunction with only the first semiconductor chip 710A of the first channel group 700A. First, data I/O signals I/O-1, I/O-2, . . . and I/O-n may be transmitted to the stack package 700 through the first pads 701a, 701b, . . . and 701n. A first channel flag signal having a logic "high" level, a second channel flag signal having a logic "low" level and a third channel flag signal having a logic "low" level may be transmitted to the stack package 700 through the second pads 702a, 702b, and 702c, respectively. Further, a first chip enable signal having a logic "high" level and a second chip enable signal having a logic "low" level may be transmitted to the stack package 700 through the third pads 703a and the third pad 703b, respectively. This signal transmission may be executed by an external controller disposed outside the stack package 700 or an internal controller disposed inside the stack package 700. In various embodiments, the channel flag signals, the chip enable signals and the data I/O signals may be sequentially processed or inputted by an extra clock signal, but not limited thereto. For example, the processing sequence of the channel flag signals, the chip enable signals and the data I/O signals may be changed according to a design scheme.

The data I/O signals I/O-1, I/O-2, . . . and I/O-n applied to the first pads 701a, 701b, . . . and 701n may be transmitted to the first data I/O pads 711a, 711b, . . . and 711n of the first semiconductor chip 710A, the second data I/O pads 721a, 721b, . . . and 721n of the second semiconductor chip 720A, the third data I/O pads 731a, 731b, . . . and 731n of the third semiconductor chip 730B, the fourth data I/O pads 741a, 741b, . . . and 741n of the fourth semiconductor chip 740B, the fifth data I/O pads 751a, 751b, . . . and 751n of the fifth semiconductor chip 750C, and the sixth data I/O pads 761a, 761b, . . . and 761n of the sixth semiconductor chip 760C through the first wires 771a, 771b, . . . and 771n regardless of the channel configuration of the stack package 700. Although the data I/O signals I/O-1, I/O-2, . . . and I/O-n are transmitted to all the first, second, third, fourth, fifth, and sixth data I/O pads of the first, second, third, fourth, fifth, and sixth semiconductor chips 710A, 720A, 730B, 740B, 750C, and 750C regardless of the channel configuration of the stack package 700, the data I/O signals I/O-1, I/O-2, . . . and I/O-n may be selectively transmitted to only one of the main circuit portions of the first, second, third, fourth, fifth, and sixth semiconductor chips 710A, 720A, 730B, 740B, 750C, and 750C according to a combination of the channel flag signals and the chip enable signals, as described more fully hereinafter. For example, according to a combination of the channel flag signals and the chip enable signals, the data I/O signals I/O-1, I/O-2, . . . and I/O-n may be selectively transmitted to only the main circuit portion of the first semiconductor chip 710A and may not be transmitted to the main circuit portions of the remaining semiconductor chips.

The first channel flag signal (having a logic "high" level) applied to the second pad 702a on the package substrate may be transmitted to only the input terminals of the AND gates 810 of the first and second semiconductor chips 710A and 720A included in the first channel group 700A. The second channel flag signal (having a logic "low" level) applied to the second pad 702b on the package substrate may be transmitted to the input terminals of the AND gates 810 of the third and fourth semiconductor chips 730B and 740B included in the second channel group 700B. The third channel flag signal (having a logic "low" level) applied to the second pad 702c on the package substrate may be transmitted to the input terminals of the AND gates 810 of the fifth and sixth semiconductor chips 750C and 750C included in the third channel group 700C. In addition, the first chip enable signal (having a logic "high" level) applied to the third pad 703a on the package substrate may be transmitted to the input terminals of the AND gates 810 of the first, third, and fifth semiconductor chips 710A, 730B, and 750C. The second chip enable signal (having a logic "low" level) applied to the third pad 703b on the package substrate may be transmitted to the input terminals of the AND gates 810 of the second, fourth, and sixth semiconductor chips 720A, 740B, and 760C.

Under the bias conditions described above, the AND gate 810 of the first semiconductor chip 710A may generate an output signal having a logic "high" level in response to the first channel flag signal and the first chip enable signal having logic "high" levels. However, the AND gate 810 of the second semiconductor chip 720A may generate an output signal having a logic "low" level in response to the first channel flag signal having a logic "high" level and the second chip enable signal having a logic "low" level. Thus, the switching portion 820 of the first semiconductor chip 710A may be turned-on to transmit the data I/O signals I/O-1, I/O-2, . . . and I/O-n from the first semiconductor chip 710A (or the first pads 701a, 701b, . . . and 701n) to the first pads 701a, 701b, . . . and 701n (or the first semiconductor chip 710A), and the switching portion 820 of the second semiconductor chip 720A may be turned-off not to transmit the data I/O signals I/O-1, I/O-2, . . . and I/O-n from the first semiconductor chip 710A (or the first pads 701a, 701b, . . . and 701n) to the first pads 701a, 701b, . . . and 701n (or the first semiconductor chip 710A).

The second channel flag signal having a logic "low" level may be transmitted to the input terminals of the AND gates 810 of the third and fourth semiconductor chips 730B and 740B in the second channel group 700B. Thus, all the AND gates 810 of the third and fourth semiconductor chips 730B and 740B may generate output signals having logic "low" levels regardless of logic levels of the first and second chip enable signals. As a result, all the switching portions 820 in the second channel group 700B may be turned off. Similarly, the third channel flag signal having a logic "low" level may be transmitted to the input terminals of the AND gates 810 of the fifth and sixth semiconductor chips 750C and 760C in the third channel group 700C. Thus, all the AND gates 810 of the fifth and sixth semiconductor chips 750C and 760C may generate output signals having logic "low" levels regardless of logic levels of the first and second chip enable signals. As a result, all the switching portions 820 in the third channel group 700C may also be turned off. In conclusion, when the first channel flag signal has a logic "high" level and the second and third channel flag signals have logic "low" levels, all the switching portions 820 of the second and third channel groups 700B and 700C may be turned off regardless of logic levels of the first and second chip enable signals.

According to an embodiment, one of the semiconductor chips in the first to third channel groups may be selected using chip enable signals. However, the embodiments of the inventive concept are not limited thereto. That is, in various embodiments, one of the semiconductor chips in the first to third channel groups may be selected even without use of the chip enable signals.

Figure 9:
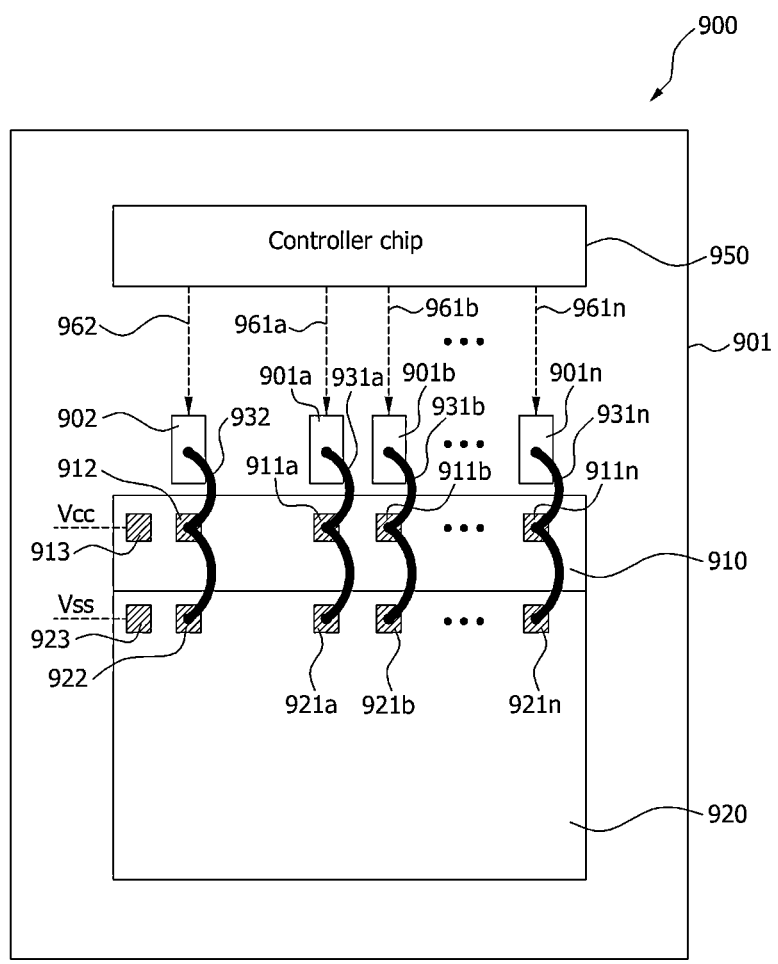
FIG. 9 is a plan view illustrating a system in package including a single channel stack package according to an embodiment.

FIG. 9 is a plan view illustrating a system in package including a single channel stack package according to an embodiment. Referring to FIG. 9, a system in package 900 according to an embodiment may be configured to include at least one memory chip and at least one logic chip constituting a single channel group. For example, the system in package 900 may be configured to include first and second semiconductor chips 910 and 920 (e.g., first and second memory chips) sequentially stacked on a first region of a package substrate 901 and a controller chip 950 disposed on a second region of the package substrate 901. A plurality of first pads 901a, 901b, . . . and 901n and a second pad 902 may be disposed on the package substrate 901 between the first and second regions of the package substrate 901. The plurality of first pads 901a, 901b, . . . and 901n and the second pad 902 may act as bond fingers. The plurality of first pads 901a, 901b, . . . and 901n may be electrically connected to respective ones of a plurality of data I/O terminals of the controller chip 950 through a plurality of conductive patterns 961a, 961b, . . . and 961n corresponding to data I/O lines, as indicated by arrows in FIG. 9. The conductive patterns 961a, 961b, . . . and 961n may be disposed in the package substrate 901. The second pad 902 may be electrically connected to a flag signal terminal of the controller chip 950 through a conductive pattern 962 corresponding to a flag signal line, as indicated by an arrow in FIG. 9. The conductive pattern 962 may be disposed in the package substrate 901.

In various embodiments, the first and second semiconductor chips 910 and 920 may be flash memory chips. However, the first and second semiconductor chips 910 and 920 may not be limited to the flash memory chips. For example, the first and second semiconductor chips 910 and 920 may be other memory chips such as magnetic random access memory (MRAM) chips, phase change random access memory (PRAM) chips or the like. The first semiconductor chip 910 may include a plurality of first data I/O pads 911a, 911b, . . . and 911n, at least one first flag pad 912, and a first buffer (not shown). The plurality of first data I/O pads 911a, 911b, . . . and 911n, and the at least one first flag pad 912 may be disposed on a semiconductor substrate of the first semiconductor chip 910, and the first buffer may be disposed in the semiconductor substrate of the first semiconductor chip 910. Similarly, the second semiconductor chip 920 may include a plurality of second data I/O pads 921a, 921b, . . . and 921n, at least one second flag pad 922, and a second buffer (not shown). The plurality of second data I/O pads 921a, 921b, . . . and 921n, and the at least one second flag pad 922 may be disposed on a semiconductor substrate of the second semiconductor chip 920, and the second buffer may be disposed in the semiconductor substrate of the second semiconductor chip 920.

The first semiconductor chip 910 may receive or output data I/O signals through the first data I/O pads 911a, 911b, . . . and 911n, and the second semiconductor chip 920 may receive or output data I/O signals through the second data I/O pads 921a, 921b, . . . and 921n. The first and second data I/O pads 911a, 911b, . . . , 911c, 921a, 921b, . . . and 921n may be electrically connected to the first pads 901a, 901b, . . . and 901n disposed on the package substrate 901 through first wires 931a, 931b, . . . and 931n. That is, the first data I/O pad 911a, the second data I/O pad 921a, and the first pad 901a may be electrically connected to each other through the first wire 931a. Thus, one of data signals outputted from the controller chip 950 may be transmitted to the first and second semiconductor chips 910 and 920 through the first pad 901a on the package substrate 901 and the first wire 931a, and one of data signals outputted from the first or second semiconductor chip 910 or 920 may be transmitted to the controller chip 950 through the first wire 931a and the first pad 901a.

Similarly, the first data I/O pad 911b, the second data I/O pad 921b and the first pad 901b may be electrically connected to each other through the first wire 931b. Thus, one of data signals outputted from the controller chip 950 may be transmitted to the first and second semiconductor chips 910 and 920 through the first pad 901b on the package substrate 901 and the first wire 931b, and one of data signals outputted from the first or second semiconductor chip 910 or 920 may be transmitted to the controller chip 950 through the first wire 931b and the first pad 901b. These connection configurations are equally applicable to the remaining first data I/O pads 911c, . . . and 911n, the remaining second data I/O pads 921c, . . . and 921n, and the remaining first pads 901c, . . . and 901n on the package substrate 901. Thus, the first data I/O pad 911n, the second data I/O pad 921n and the first pad 901n may also be electrically connected to each other through the first wire 931n.

The first and second semiconductor chips 910 and 920 may receive a flag signal through the first and second flag pads 912 and 922, respectively. The first and second flag pads 912 and 922 may be electrically connected to the second pad 902 through a second wire 932. That is, the flag signal applied to the second pad 902 may be transmitted to both the first and second flag pads 912 and 922 through the second wire 932. The flag signal may be generated in the controller chip 950 and may be transmitted to the buffers in the first and second semiconductor chips 910 and 920. The flag signal may be used as one of switching input signals that control switching operations of internal circuits included in the buffers. The first and second semiconductor chips 910 and 920 may include a first power supply terminal (or a first power supply pad) 913 for receiving a first power voltage signal Vcc and a second power supply terminal (or a second power supply pad) 923 for receiving a second power voltage signal Vss, respectively. The first power voltage signal Vcc may have a different voltage from the second power voltage signal Vss. For example, when the first power voltage signal Vcc has a voltage corresponding to a logic "high" level, the second power voltage signal Vss may have a voltage corresponding to a logic "low" level. The first buffer in the first semiconductor chip 910 and the second buffer in the second semiconductor chip 920 may have substantially the same configuration as described with reference to FIGS. 2 and 3. Further, a method of operating the system in package 900 may also be substantially the same as described with reference to FIGS. 1, 2, and 3.

Figure 10:
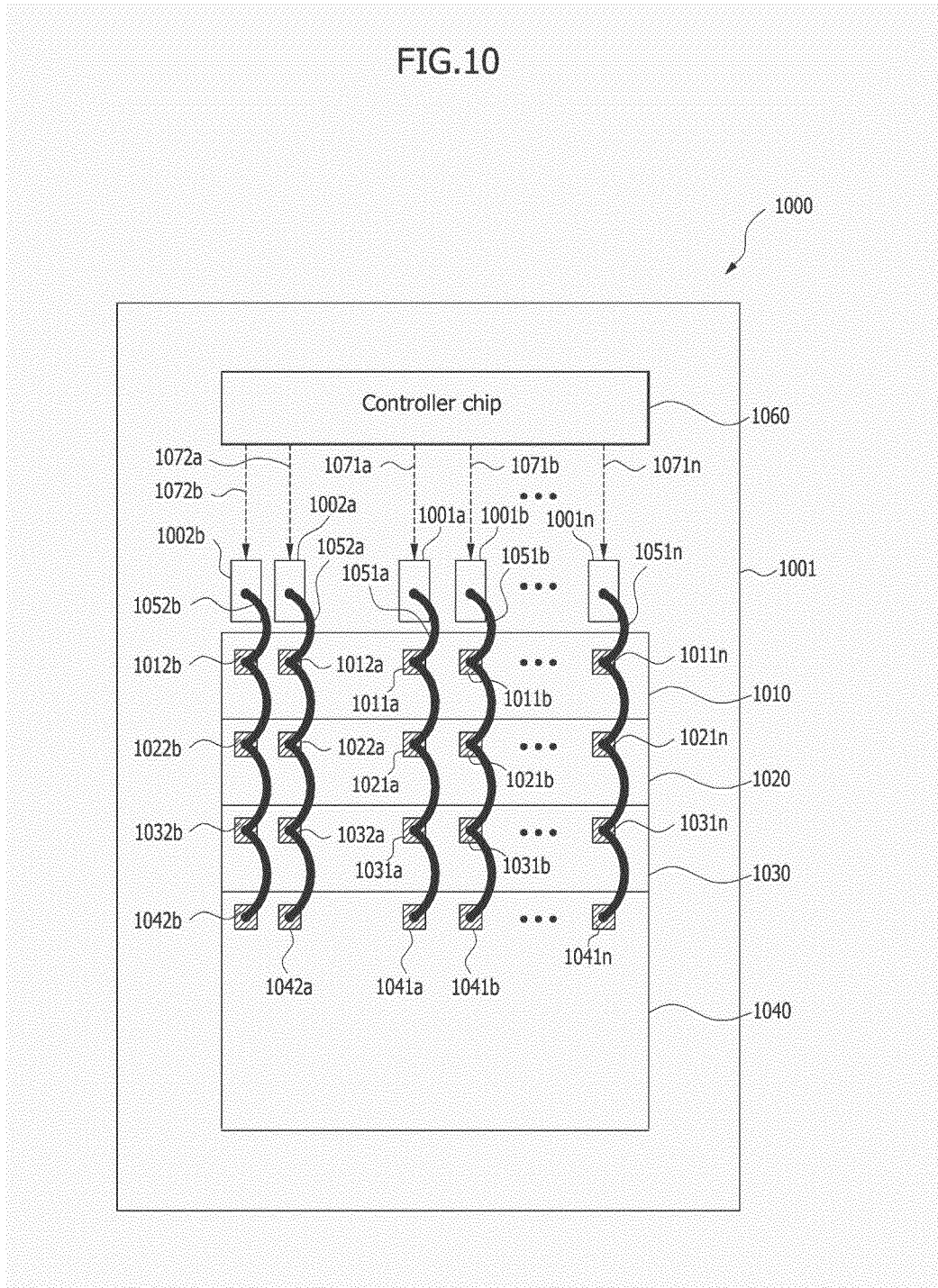
FIG. 10 is a plan view illustrating a system in package including a single channel stack package according to an embodiment.

FIG. 10 is a plan view illustrating a system in package including a single channel stack package according to an embodiment. Referring to FIG. 10, a system in package 1000 according to an embodiment may be configured to include at least one memory chip and at least one logic chip constituting a single channel group. For example, the system in package 1000 may be configured to include first to fourth semiconductor chips 1010, 1020, 1030, and 1040 (e.g., first to fourth memory chips) sequentially stacked on a first region of a package substrate 1001 and a controller chip 1060 disposed on a second region of the package substrate 1001. A plurality of first pads 1001a, 1001b, . . . and 1001n and second pads 1002a and 1002b may be disposed on the package substrate 1001 between the first and second regions of the package substrate 1001. In various embodiments, the first to fourth semiconductor chips 1010, 1020, 1030, and 1040 may be flash memory chips, but not limited thereto. For example, the first to fourth semiconductor chips 1010, 1020, 1030, and 1040 may be magnetic random access memory (MRAM) chips, phase change random access memory (PRAM) chips or the like. Although the embodiments are described in conjunction with an example that four semiconductor memory chips are stacked on the package substrate 1001, these embodiment are merely an example of the inventive concepts. That is, in various embodiments, five or more stacked semiconductor memory chips may be stacked on the package substrate 1001.

The first pads 1001a, 1001b, . . . and 1001n may act as bond fingers for transmitting data I/O signals, and the second pads 1002a and 1002b may act as bond fingers for transmitting flag signals. The plurality of first pads 1001a, 1001b, . . . and 1001n may be electrically connected to respective ones of a plurality of data I/O terminals of the controller chip 1060 through a plurality of conductive patterns 1071a, 1071b, . . . and 1071n corresponding to data I/O lines, as indicated by arrows in FIG. 10. The conductive patterns 1071a, 1071b, . . . and 1071n may be disposed in the package substrate 1001. The second pads 1002a and 1002b may be electrically connected to respective ones of flag signal terminals of the controller chip 1060 through conductive patterns 1072a and 1072b corresponding to flag signal lines, as indicated by arrows in FIG. 10. The conductive patterns 1072a and 1072b may be disposed in the package substrate 1001.

The number of the second pads may depend on the number of the semiconductor memory chips stacked on the package substrate 1001. Specifically, according to a combination of logic levels of the flag signals applied to the second pads 1002a and 1002b, only one of the semiconductor chips 1010, 1020, 1030, and 1040 may be selected and electrically connected to the first pads 1001a, 1001b, . . . and 1001n. This electrical connection may be determined by logic levels of input signals of a logic gate (e.g., the exclusive NOR gate 210 of FIG. 2) in each of the semiconductor chips 1010, 1020, 1030, and 1040. For example, if the number of the second pads is two, four semiconductor chips can be stacked on the package substrate 1001. Further, if the number of the second pads is three, eight semiconductor chips can be stacked on the package substrate 1001. In general, when the number of the second pads is "n", the number of the semiconductor chips, which can be stacked on the package substrate 1001 may be "$2^n$".

The first semiconductor chip 1010 may include a plurality of first data I/O pads 1011a, 1011b, . . . and 1011n, a pair of first flag pads 1012a and 1012b, and a first buffer (not shown). The second semiconductor chip 1020 may include a plurality of second data I/O pads 1021a, 1021b, . . . and 1021n, a pair of second flag pads 1022a and 1022b, and a second buffer (not shown). The third semiconductor chip 1030 may include a plurality of third data I/O pads 1031a, 1031b, . . . and 1031n, a pair of third flag pads 1032a and 1032b, and a third buffer (not shown). The fourth semiconductor chip 1040 may include a plurality of fourth data I/O pads 1041a, 1041b, . . . and 1041n, a pair of fourth flag pads 1042a and 1042b, and a fourth buffer (not shown).

The first, second, third, and fourth semiconductor chips 1010, 1020, 1030, and 1040 may receive or output the data I/O signals through the first data I/O pads 1011a, 1011b, . . . and 1011n, the second data I/O pads 1021a, 1021b, . . . and 1021n, the third data I/O pads 1031a, 1031b, . . . and 1031n, and the fourth data I/O pads 1041a, 1041b, . . . and 1041n, respectively. The first, second, third, and fourth data I/O pads 1011a, 1011b, . . . , 1011c, 1021a, 1021b, . . . , 1021n, 1031a, 1031b, . . . , 1031n, 1041a, 1041b, . . . and 1041n may be electrically connected to the first pads 1001a, 1001b, . . . and 1001n disposed on the package substrate 1001 through first wires 1051a, 1051b, . . . and 1051n. That is, the first, second, third, and fourth data I/O pads 1011a, 1021a, 1031a, and 1041a, and the first pad 1001a may be electrically connected to each other through the first wire 1051a. Thus, one of data signals outputted from the controller chip 1060 may be transmitted to the first to fourth semiconductor chips 1010, 1020, 1030, and 1040 through the first pad 1001a on the package substrate 1001 and the first wire 1051a, and one of data signals outputted from the first, second, third, or fourth semiconductor chip 1010, 1020, 1030, or 1040 may be transmitted to the controller chip 1060 through the first wire 1051a and the first pad 1001a.

Similarly, the first data I/O pad 1011b, the second data I/O pad 1021b and the first pad 1001b may be electrically connected to each other through the first wire 1051*b*. Thus, one of data signals outputted from the controller chip 1060 may be transmitted to the first to fourth semiconductor chips 1010, 1020, 1030, and 1040 through the first pad 1001*b* and the first wire 1051*b*, and one of data signals outputted from the first, second, third, or fourth semiconductor chip 1010, 1020, 1030, or 1040 may be transmitted to the controller chip 1060 through the first wire 1051*b* and the first pad 1001*b*. These connection configurations are equally applicable to the remaining first data I/O pads 1011*c*, . . . and 1011*n*, the remaining second data I/O pads 1021*c*, . . . and 1021*n*, and the remaining first pads 1001*c*, . . . and 1001*n*. Thus, the first data I/O pad 1011*n*, the second data I/O pad 1021*n* and the first pad 1001*n* may also be electrically connected to each other through the first wire 1051*n*.

The first, second, third, and fourth semiconductor chips 1010, 1020, 1030, and 1040 may receive first and second flag signals through the first flag pads 1012*a* and 1012*b*, the second flag pads 1022*a* and 1022*b*, the third flag pads 1032*a* and 1032*b*, and the fourth flag pads 1042*a* and 1042*b*, respectively. The first, second, third, and fourth flag pads 1012*a*, 1022*a*, 1032*a*, and 1042*a* may be electrically connected to the second pad 1002*a* through a second wire 1052*a*. That is, the first flag signal applied to the second pad 1002*a* may be transmitted to the first to fourth flag pads 1012*a*, 1022*a*, 1032*a*, and 1042*a* through the second wire 1052*a*. The first flag signal may be generated in the controller chip 1060. Similarly, the first, second, third, and fourth flag pads 1012*b*, 1022*b*, 1032*b*, and 1042*b* may be electrically connected to the second pad 1002*b* through a second wire 1052*b*. That is, the second flag signal applied to the second pad 1002*b* may be transmitted to the first to fourth flag pads 1012*b*, 1022*b*, 1032*b*, and 1042*b* through the second wire 1052*b*. The second flag signal may also be generated in the controller chip 1060. Both the first and second flag signals may be transmitted to a first buffer of the first semiconductor chip 1010, a second buffer of the second semiconductor chip 1020, a third buffer of the third semiconductor chip 1030, and a fourth buffer of the fourth semiconductor chip 1040. The first and second flag signals may be used as switching input signals that control switching operations of internal circuits included in the first to fourth buffers.

Each of the first to fourth buffers may have substantially the same configuration as described with reference to FIGS. 2 and 3. However, the input signals of each exclusive NOR gate used in the present embodiments may be different from the input signals of the exclusive NOR gate 210 of FIG. 2. That is, in these embodiments, the first and second flag signals may be used as the input signals of the exclusive NOR gate included in each of the first to fourth semiconductor chips 1010, 1020, 1030, and 1040. Thus, logic levels of the output signals of the exclusive NOR gates in the first to fourth semiconductor chips 1010, 1020, 1030, and 1040 may depend on the logic levels of the first and second flag signals. Therefore, only one of the buffers in the first to fourth semiconductor chips 1010, 1020, 1030, and 1040 may be selectively turned on according to a combination of the first and second flag signals, and the other buffers may be turned off.

Figure 11:
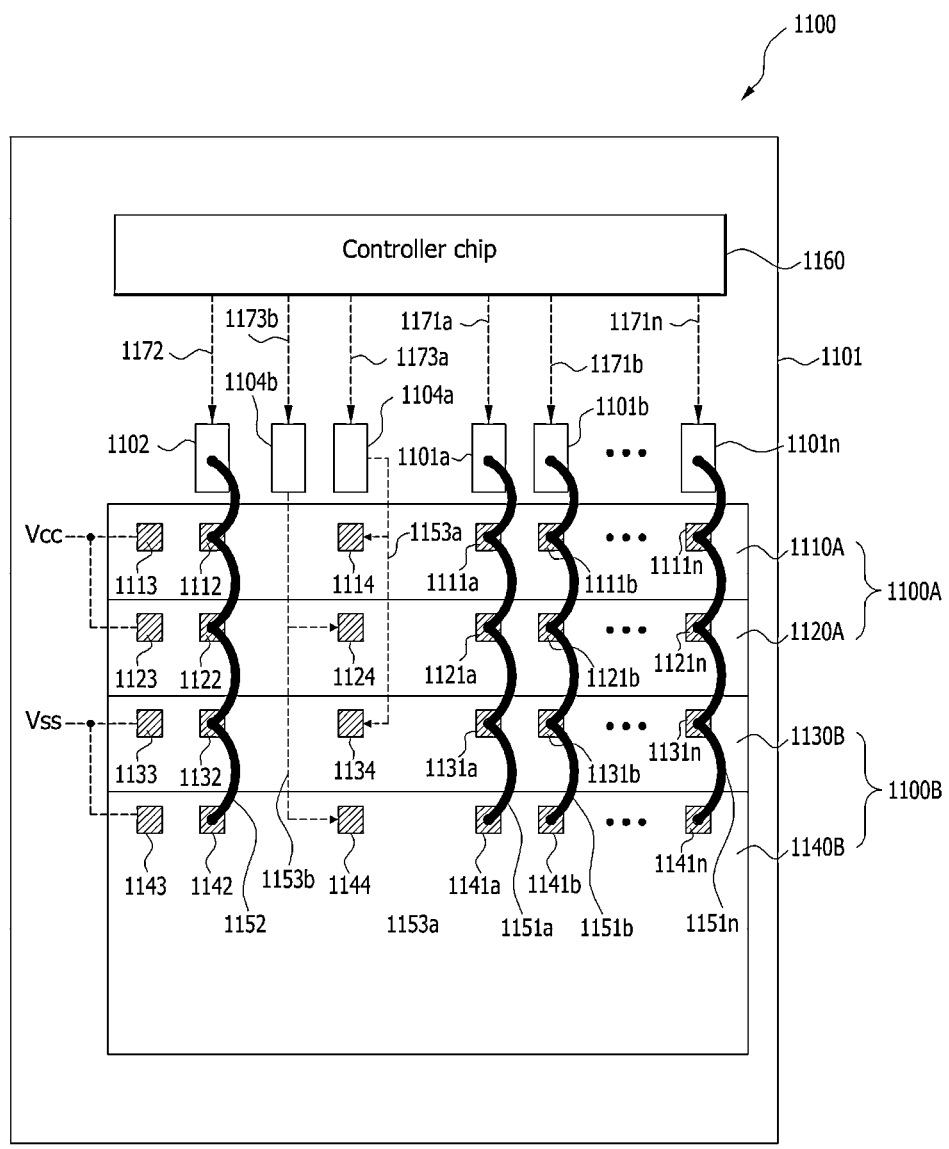
FIG. 11 is a plan view illustrating a system in package including a double channel stack package according to an embodiment.

FIG. 11 is a plan view illustrating a system in package including a double channel stack package according to an embodiment. Referring to FIG. 11, a system in package 1100 according to an embodiment may be configured to include memory chips and a logic chip constituting a plurality of channel groups. For example, the system in package 1100 may be configured to include first to fourth semiconductor chips 1110A, 1120A, 1130B, and 1140B (e.g., first to fourth memory chips) sequentially stacked on a first region of a package substrate 1101. In various embodiments, the first to fourth semiconductor chips 1110A, 1120A, 1130B, and 1140B may be stacked such that at least first edges of the first to fourth semiconductor chips 1110A, 1120A, 1130B, and 1140B exhibit a step shape. In various embodiments, the first to fourth semiconductor chips 1110A, 1120A, 1130B, and 1140B may be flash memory chips, but not limited thereto. For example, the first to fourth semiconductor chips 1110A, 1120A, 1130B and 1140B may be magnetic random access memory (MRAM) chips, phase change random access memory (PRAM) chips or the like.

Electrical signals of the first to fourth semiconductor chips 1110A, 1120A, 1130B, and 1140B may be transmitted through a plurality of channels to improve the operation speed of the system in package 1100. According to an embodiment, the first and second semiconductor chips 1110A and 1120A may communicate with each other through a first channel and the third and fourth semiconductor chips 1130B and 1140B may communicate with each other through a second channel. That is, the first and second semiconductor chips 1110A and 1120A may constitute a first channel group 1100A, and the third and fourth semiconductor chips 1130B and 1140B may constitute a second channel group 1100B. Although the embodiments are described in conjunction with examples that each of the first and second channel groups 1100A and 1100B include two stacked semiconductor chips, the embodiments are merely examples of the inventive concepts. That is, in various embodiments, each channel group may include three or more stacked semiconductor chips. A controller chip 1160 may be disposed on a second region of the package substrate 1101.

A plurality of first pads 1101*a*, 1101*b*, . . . and 1101*n*, a second pad 1102, and third pads 1104*a* and 1104*b* may be disposed on the package substrate 1101 between the first and second regions of the package substrate 1101. The first pads 1101*a*, 1101*b*, . . . and 1101*n* on the package substrate 1101 may act as bond fingers for transmitting data I/O signals. Thus, the first pads 1101*a*, 1101*b*, . . . and 1101*n* may be used as I/O pads for transmitting the data I/O signals into the first and second semiconductor chips 1110A and 1120A in the first channel group 1100A and the third and fourth semiconductor chips 1130B and 1140B in the second channel group 1100B or outputting the data I/O signals generated from the first and second semiconductor chips 1110A and 1120A in the first channel group 1100A and the third and fourth semiconductor chips 1130B and 1140B in the second channel group 1100B. The number of the first pads 1101*a*, 1101*b*, . . . and 1101*n* may correspond to the number of the data I/O signals.

The second pad 1102 may act as a bond finger for transmitting a flag signal. Thus, the second pad 1102 may be used as an input pad for transmitting the flag signal into the first and second semiconductor chips 1110A and 1120A in the first channel group 1100A and the third and fourth semiconductor chips 1130B and 1140B in the second channel group 1100B. The third pads 1104*a* and 1104*b* may act as bond fingers for transmitting chip enable signals. Thus, the third pads 1104*a* and 1104*b* may be used as input pads for transmitting the chip enable signals into the first and second semiconductor chips 1110A and 1120A in the first channel group 1100A and the third and fourth semiconductor chips 1130B and 1140B in the second channel group 1100B. The number of the third pads may correspond to the number of the semiconductor chips included in each of the channel groups. In an embodiment, the number of the semiconductor chips included in each of the channel groups is two. Thus, the number of the third pads may be two.

The first pads 1101a, 1101b, ... and 1101n may be electrically connected to respective ones of a plurality of data I/O terminals of the controller chip 1160 through a plurality of conductive patterns 1171a, 1171b, ... and 1171n corresponding to data I/O lines, as indicated by arrows in FIG. 11. The conductive patterns 1171a, 1171b, ... and 1171n may be disposed in the package substrate 1101. The second pad 1102 may be electrically connected to a flag signal terminal of the controller chip 1160 through a conductive pattern 1172 corresponding to a flag signal line, as indicated by an arrow in FIG. 11. The conductive pattern 1172 may be disposed in the package substrate 1101. The third pads 1104a and 1104b may be electrically connected to respective ones of chip enable terminals of the controller chip 1160 through conductive patterns 1173a and 1173b corresponding to chip enable signal lines, as indicated by arrows in FIG. 11. The conductive patterns 1173a and 1173b may be disposed in the package substrate 1101.

The first semiconductor chip 1110A may include a plurality of first data I/O pads 1111a, 1111b, ... and 1111n, a first channel flag pad 1112, a first power supply pad 1113, and a first chip enable pad 1114. The second semiconductor chip 1120A may include a plurality of second data I/O pads 1121a, 1121b, ... and 1121n, a second channel flag pad 1122, a second power supply pad 1123, and a second chip enable pad 1124. The third semiconductor chip 1130B may include a plurality of third data I/O pads 1131a, 1131b, ... and 1131n, a third channel flag pad 1132, a third power supply pad 1133, and a third chip enable pad 1134. The fourth semiconductor chip 1140B may include a plurality of fourth data I/O pads 1141a, 1141b, ... and 1141n, a fourth channel flag pad 1142, a fourth power supply pad 1143, and a fourth chip enable pad 1144. Further, although not shown in the drawings, the first to fourth semiconductor chips 1110A, 1120A, 1130B, and 1140B may include a first buffer, a second buffer, a third buffer, and a fourth buffer, respectively. The first, second, third, and fourth buffers may have substantially the same configuration.

The first, second, third, and fourth semiconductor chips 1110A, 1120A, 1130B and 1140B may receive or output the data I/O signals through the first data I/O pads 1111a, 1111b, ... and 1111n, the second data I/O pads 1121a, 1121b, ... and 1121n, the third data I/O pads 1131a, 1131b, ... and 1131n, and the fourth data I/O pads 1141a, 1141b, ... and 1141n, respectively. The first, second, third and fourth data I/O pads 1111a, 1111b, ..., 1111c, 1121a, 1121b, ..., 1121n, 1131a, 1131b, ..., 1131n, 1141a, 1141b, ... and 1141n may be electrically connected to the first pads 1101a, 1101b, ... and 1101n disposed on the package substrate 1101 through first wires 1151a, 1151b, ... and 1151n.

Specifically, the first, second, third, and fourth data I/O pads 1111a, 1121a, 1131a, and 1141a may be electrically connected to the first pad 1101a on the package substrate 1101 through the first wire 1151a. Thus, one of data signals outputted from the controller chip 1160 may be transmitted to the first to fourth semiconductor chips 1110A, 1120A, 1130B, and 1140B through the first pad 1101a and the first wire 1151a, and one of data signals outputted from the first, second, third, or fourth semiconductor chip 1110A, 1120A, 1130B, or 1140B may be transmitted to the controller chip 1160 through the first wire 1151a and the first pad 1101a.

Further, the first, second, third, and fourth data I/O pads 1111b, 1121b, 1131b, and 1141b may be electrically connected to the first pad 1101b on the package substrate 1101 through the first wire 1151b. Thus, one of data signals outputted from the controller chip 1160 may be transmitted to the first to fourth semiconductor chips 1110A, 1120A, 1130B, and 1140B through the first pad 1101b and the first wire 1151b, and one of data signals outputted from the first, second, third, or fourth semiconductor chip 1110A, 1120A, 1130B, or 1140B may be transmitted to the controller chip 1160 through the first wire 1151b and the first pad 1101b.

Similarly, the first, second, third, and fourth data I/O pads 1111n, 1121n, 1131n, and 1141n may be electrically connected to the first pad 1101n through the first wire 1151n. Thus, one of data signals outputted from the controller chip 1160 may be transmitted to the first to fourth semiconductor chips 1110A, 1120A, 1130B, and 1140B through the first pad 1101n and the first wire 1151n, and one of data signals outputted from the first, second, third, or fourth semiconductor chip 1110A, 1120A, 1130B, or 1140B may be transmitted to the controller chip 1160 through the first wire 1151n and the first pad 1101n.

The first semiconductor chip 1110A may receive a channel flag signal through the first channel flag pad 1112, and the second semiconductor chip 1120A may receive the channel flag signal through the second channel flag pad 1122. Similarly, the third semiconductor chip 1130B may receive the channel flag signal through the third channel flag pad 1132, and the fourth semiconductor chip 1140B may receive the channel flag signal through the fourth channel flag pad 1142. Therefore, the first, second, third, and fourth channel flag pads 1112, 1122, 1132, and 1142 may be electrically connected to the second pad 1102 on the package substrate 1101 through a second wire 1152.

The first, second, third, and fourth power supply pads 1113, 1123, 1133, and 1143 may correspond to input pads for applying power voltage signals to the first, second, third, and fourth semiconductor chips 1110A, 1120A, 1130B, and 1140B, respectively. In various embodiments, a first power voltage signal Vcc having a first logic level, for example, a logic "high" level may be applied to both the first and second power supply pads 1113 and 1123 of the first and second semiconductor chips 1110A and 1120A constituting the first channel group 1100A, and a second power voltage signal Vss having a second logic level, for example, a logic "low" level may be applied to both the third and fourth power supply pads 1133 and 1143 of the third and fourth semiconductor chips 1130A and 1140A constituting the second channel group 1100B. In any case, the first and second power voltage signals Vcc and Vss may have different logic levels from each other. In an embodiment, the first power voltage signal Vcc may have a logic "high" level and the second power voltage signal Vss may have a logic "low" level.

The first, second, third, and fourth chip enable pads 1114, 1124, 1134, and 1144 may correspond to input pads for applying the chip enable signals to the first, second, third, and fourth semiconductor chips 1110A, 1120A, 1130B, and 1140B, respectively. One of the chip enable pads 1114 and 1124 of the first and second semiconductor chips 1110A and 1120A constituting the first channel group 1100A may be electrically connected to one of the chip enable pads 1134 and 1144 of the third and fourth semiconductor chips 1130B and 1140B constituting the second channel group 1100B. For example, the first chip enable pad 1114 of the first semiconductor chip 1110A in the first channel group 1100A and the third chip enable pad 1134 of the third semiconductor chip 1130B in the second channel group 1100B may be electrically connected to the third pad 1104a on the package substrate 1101 through a first interconnection line 1153a. Similarly, the second chip enable pad 1124 of the second semiconductor chip 1120A in the first channel group 1100A and the fourth chip enable pad 1144 of the fourth semiconductor chip 1140B in the second channel group 1100B may be electrically connected to the third pad 1104b on the package substrate 1101 through a second interconnection line 1153b. The first and second interconnection lines 1153a and 1153b may include conductive lines disposed in the package substrate 1101, but not limited thereto.

Under the connection configuration described above, if a first chip enable signal is applied to the third pad 1104a, the first chip enable signal may be transmitted to both the first semiconductor chip 1110A in the first channel group 1100A and the third semiconductor chip 1130B in the second channel group 1100B. In addition, if a second chip enable signal is applied to the third pad 1104b, the second chip enable signal may be transmitted to both the second semiconductor chip 1120A in the first channel group 1100A and the fourth semiconductor chip 1140B in the second channel group 1100B. In various embodiments, the first and second chip enable signals may be sequentially applied to the semiconductor chips. That is, the first and second chip enable signals may not be simultaneously applied to the pair of third pads 1104a and 1104b for a predetermined duration. Alternatively, the first and second chip enable signals may be simultaneously applied to the pair of third pads 1104a and 1104b. In such a case, the first and second chip enable signals may have different logic levels from each other. For example, the first chip enable signal having a logic "high" level and the second chip enable signal having a logic "low" level may be simultaneously applied to the pair of third pads 1104a and 1104b, or the first chip enable signal having a logic "low" level and the second chip enable signal having a logic "high" level may be simultaneously applied to the pair of third pads 1104a and 1104b.

Each of the first to fourth buffers included in the first to fourth semiconductor chips 1110A, 1120A, 1130B, and 1140B may have substantially the same configuration as described with reference to in FIGS. 6 and 3. Further, a method of operating the system in package 1100 may also be substantially the same as described with reference to FIGS. 5 and 6.

Figure 12:
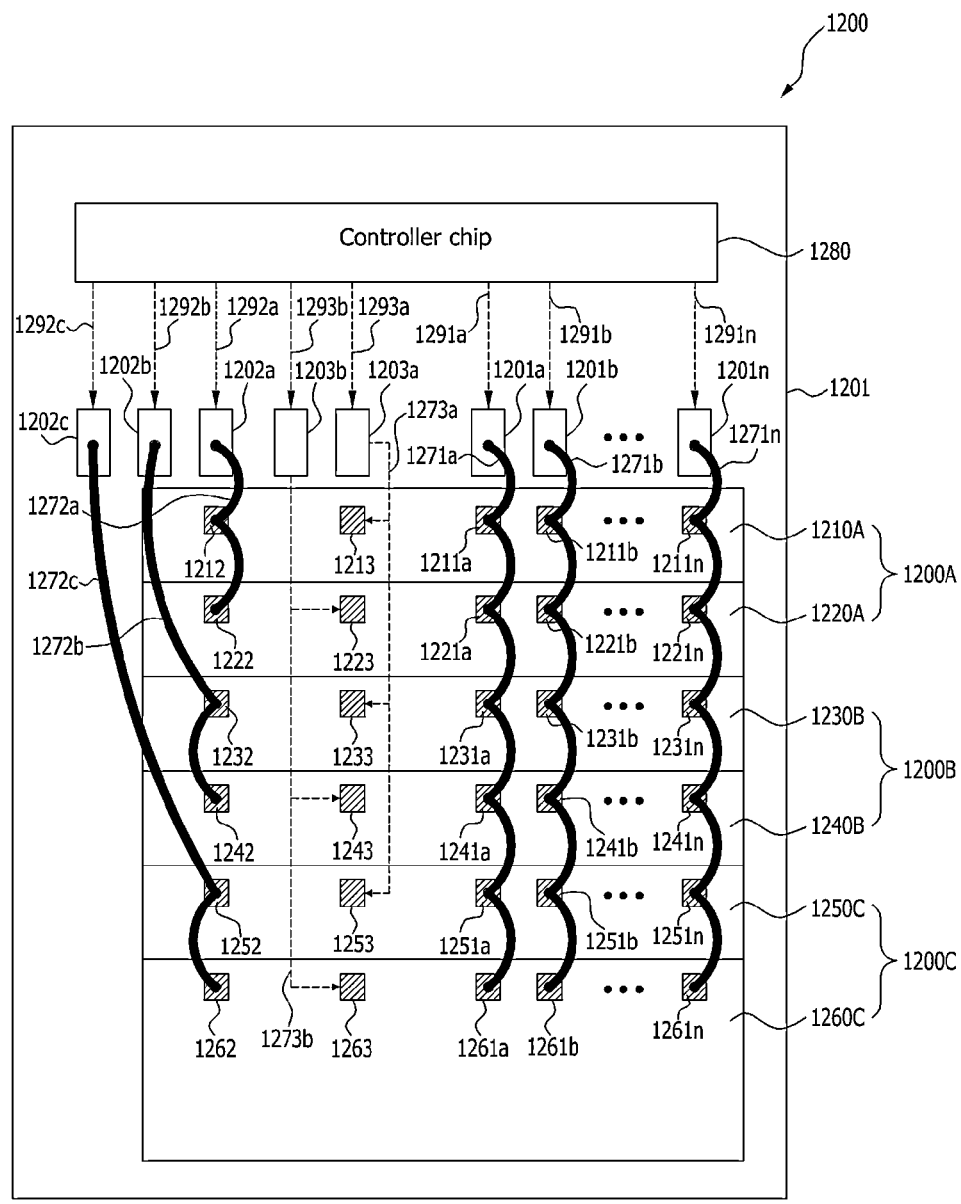
FIG. 12 is a plan view illustrating a system in package including a multi channel stack package according to an embodiment.

FIG. 12 is a plan view illustrating a system in package including a multi channel stack package according to an embodiment. Referring to FIG. 12, a system in package 1200 according to an embodiment may be configured to include memory chips and a logic chip constituting at least three channel groups. For example, the system in package 1200 may be configured to include first to sixth semiconductor chips 1210A, 1220A, 1230B, 1240B, 1250C, and 1260C (e.g., first to sixth memory chips) sequentially stacked on a first region of a package substrate 1201. In various embodiments, the first to sixth semiconductor chips 1210A, 1220A, 1230B, 1240B, 1250C, and 1260C may be divided into three channel groups (e.g., first to third channel groups), and the first to third channel groups may be disposed on three different regions of the package substrate 1201, respectively. According to an embodiment, the first to sixth semiconductor chips 1210A, 1220A, 1230B, 1240B, 1250C, and 1260C may be stacked on the first region such that at least first edges of the first to sixth semiconductor chips 1210A, 1220A, 1230B, 1240B, 1250C, and 1260C have a step shape. In various embodiments, the first to sixth semiconductor chips 1210A, 1220A, 1230B, 1240B, 1250C, and 1260C may be flash memory chips, but not limited thereto. For example, the first to sixth semiconductor chips 1210A, 1220A, 1230B, 1240B, 1250C, and 1260C may be magnetic random access memory (MRAM) chips, phase change random access memory (PRAM) chips or the like.

Electrical signals of the first to sixth semiconductor chips 1210A, 1220A, 1230B, 1240B, 1250C, and 1260C may be transmitted through a plurality of channels to improve the operation speed of the system in package 1200. According to an embodiment, the first and second semiconductor chips 1210A and 1220A may communicate with each other through a first channel, the third and fourth semiconductor chips 1230B and 1240B may communicate with each other through a second channel, and the fifth and sixth semiconductor chips 1250C and 1260C may communicate with each other through a third channel. That is, the first and second semiconductor chips 1210A and 1220A may constitute a first channel group 1200A, the third and fourth semiconductor chips 1230B and 1240B may constitute a second channel group 1200B, and the fifth and sixth semiconductor chips 1250C and 1260C may constitute a third channel group 1200C. Although the embodiments are described in conjunction with the examples that each of the first, second, and third channel groups 1200A, 1200B, and 1200C include two stacked semiconductor chips, the embodiments are merely examples of the inventive concepts. That is, in various embodiments, each channel group may include three or more stacked semiconductor chips. A controller chip 1280 may be disposed on a second region of the package substrate 1201.

A plurality of first pads 1201a, 1201b, . . . and 1201n, a plurality of second pads 1202a, 1202b, and 1202c, and a pair of third pads 1203a and 1203b may be disposed on the package substrate 1201 between the first and second regions of the package substrate 1201. The first pads 1201a, 1201b, . . . and 1201n on the package substrate 1201 may transmit data I/O signals. That is, the first pads 1101a, 1101b, . . . and 1101n may be used as I/O pads for transmitting the data I/O signals into the first channel group 1100A (e.g., the first and second semiconductor chips 1210A and 1220A), the second channel group 1100B (e.g., the third and fourth semiconductor chips 1230B and 1240B) and the third channel group 1200C (e.g., the fifth and sixth semiconductor chips 1250C and 1260C) or outputting the data I/O signals generated from the first channel group 1100A (e.g., the first and second semiconductor chips 1210A and 1220A), the second channel group 1100B (e.g., the third and fourth semiconductor chips 1230B and 1240B) and the third channel group 1200C (e.g., the fifth and sixth semiconductor chips 1250C and 1260C). The number of the first pads 1201a, 1201b, . . . and 1201n may correspond to the number of the data I/O signals.

The second pads 1202a, 1202b, and 1202c may be used as input pads for transmitting flag signals (also, referred to as channel flag signals) into the first channel group 1100A (e.g., the first and second semiconductor chips 1210A and 1220A), the second channel group 1100B (e.g., the third and fourth semiconductor chips 1230B and 1240B), and the third channel group 1200C (e.g., the fifth and sixth semiconductor chips 1250C and 1260C). The number of the second pads may correspond to the number of the channel groups. The third pads 1203a and 1203b may be used as input pads for transmitting chip enable signals into the first channel group 1100A (e.g., the first and second semiconductor chips 1210A and 1220A), the second channel group 1100B (e.g., the third and fourth semiconductor chips 1230B and 1240B), and the third channel group 1200C (e.g., the fifth and sixth semiconductor chips 1250C and 1260C). The number of the third pads may correspond to the number of the semiconductor chips included in each of the channel groups. In an embodiment, the number of the semiconductor chips included in each of the channel groups is two. Thus, the number of the third pads may be two.

The first pads 1201a, 1201b, . . . and 1201n may be electrically connected to respective ones of a plurality of data I/O terminals of the controller chip 1280 through a plurality of conductive patterns 1291a, 1291b, . . . and 1291n corresponding to data I/O lines, as indicated by arrows in FIG. 12. The conductive patterns 1291a, 1291b, . . . and 1291n may be disposed in the package substrate 1201. The second pads 1202a, 1202b, and 1202c may be electrically connected to respective ones of flag signal terminals of the controller chip 1280 through conductive patterns 1292a, 1292b, and 1292c corresponding to flag signal lines, as indicated by an arrow in FIG. 12. The conductive patterns 1292a, 1292b, and 1292c may be disposed in the package substrate 1201. The third pads 1203a and 1203b may be electrically connected to respective ones of chip enable terminals of the controller chip 1280 through conductive patterns 1293a and 1293b corresponding to chip enable signal lines, as indicated by arrows in FIG. 12. The conductive patterns 1293a and 1293b may be disposed in the package substrate 1201.

The first semiconductor chip 1210A may include a plurality of first data I/O pads 1211a, 1211b, . . . and 1211n, a first channel flag pad 1212 and a first chip enable pad 1213. The second semiconductor chip 1220A may include a plurality of second data I/O pads 1221a, 1221b, . . . and 1221n, a second channel flag pad 1222 and a second chip enable pad 1223. The third semiconductor chip 1230B may include a plurality of third data I/O pads 1231a, 1231b, . . . and 1231n, a third channel flag pad 1232 and a third chip enable pad 1233. The fourth semiconductor chip 1240B may include a plurality of fourth data I/O pads 1241a, 1241b, . . . and 1241n, a fourth channel flag pad 1242 and a fourth chip enable pad 1243. The fifth semiconductor chip 1250C may include a plurality of fifth data I/O pads 1251a, 1251b, . . . and 1251n, a fifth channel flag pad 1252 and a fifth chip enable pad 1253. The sixth semiconductor chip 1260C may include a plurality of sixth data I/O pads 1261a, 1261b, . . . and 1261n, a sixth channel flag pad 1262 and a sixth chip enable pad 1263. Further, although not shown in the drawings, the first to sixth semiconductor chips 1210A, 1220A, 1230B, 1240B, 1250C, and 1260C may include first to sixth buffers, respectively. The first to sixth buffers may have substantially the same configuration.

The first, second, third, fourth, fifth, and sixth semiconductor chips 1210A, 1220A, 1230B, 1240B, 1250C, and 1260C may receive or output the data I/O signals through the first data I/O pads 1211a, 1211b, . . . and 1211n, the second data I/O pads 1221a, 1221b, . . . and 1221n, the third data I/O pads 1231a, 1231b, . . . and 1231n, the fourth data I/O pads 1241a, 1241b, . . . and 1241n, the fifth data I/O pads 1251a, 1251b, . . . and 1251n, and the sixth data I/O pads 1261a, 1261b, . . . and 1261n, respectively. The first, second, third, fourth, fifth, and sixth data I/O pads 1211a, 1211b, . . . and 1211n, 1221a, 1221b, . . . and 1221n, 1231a, 1231b, . . . and 1231n, 1241a, 1241b, . . . and 1241n, 1251a, 1251b, . . . and 1251n, and 1261a, 1261b, . . . and 1261n may be electrically connected to the first pads 1201a, 1201b, . . . and 1201n on the package substrate 1201 through first wires 1271a, 1271b, . . . and 1271n.

Specifically, the first, second, third, fourth, fifth, and sixth data I/O pads 1211a, 1221a, 1231a, 1241a, 1251a, and 1261a may be electrically connected to the first pad 1201a through the first wire 1271a. Thus, one of data signals outputted from the controller chip 1280 may be transmitted to the first to sixth semiconductor chips 1210A, 1220A, 1230B, 1240B, 1250C, and 1260C through the first pad 1201a and the first wire 1271a, and one of data signals outputted from the first, second, third, fourth, fifth, or sixth semiconductor chip 1210A, 1220A, 1230B, 1240B, 1250C, or 1260C may be transmitted to the controller chip 1280 through the first wire 1271a and the first pad 1201a.

Further, the first, second, third, fourth, fifth, and sixth data I/O pads 1211b, 1221b, 1231b, 1241b, 1251b, and 1261b may be electrically connected to the first pad 1201b through the first wire 1271b. Thus, one of data signals outputted from the controller chip 1280 may be transmitted to the first to sixth semiconductor chips 1210A, 1220A, 1230B, 1240B, 1250C, and 1260C through the first pad 1201b and the first wire 1271b, and one of data signals outputted from the first, second, third, fourth, fifth, or sixth semiconductor chip 1210A, 1220A, 1230B, 1240B, 1250C, or 1260C may be transmitted to the controller chip 1280 through the first wire 1271b and the first pad 1201b.

Similarly, the first, second, third, fourth, fifth, and sixth data I/O pads 1211n, 1221n, 1231n, 1241n, 1251n, and 1261n may be electrically connected to the first pad 1201n through the first wire 1271n. Thus, one of data signals outputted from the controller chip 1280 may be transmitted to the first to sixth semiconductor chips 1210A, 1220A, 1230B, 1240B, 1250C, and 1260C through the first pad 1201n and the first wire 1271n, and one of data signals outputted from the first, second, third, fourth, fifth, or sixth semiconductor chip 1210A, 1220A, 1230B, 1240B, 1250C, or 1260C may be transmitted to the controller chip 1280 through the first wire 1271n and the first pad 1201n.

The first to sixth channel flag pads 1212, 1222, 1232, 1242, 1252, and 1262 may be input pads for transmitting the channel flag signals applied to the second pads 1202a, 1202b, and 1202c into the first to sixth semiconductor chips 1210A, 1220A, 1230B, 1240B, 1250C, and 1260C. The first and second channel flag pads 1212 and 1222 in the first channel group 1200A may be electrically connected to the second pad 1202a on the package substrate 1201 through a second wire 1272a. The third and fourth channel flag pads 1232 and 1242 in the second channel group 1200B may be electrically connected to the second pad 1202b on the package substrate 1201 through a second wire 1272b. The fifth and sixth channel flag pads 1252 and 1262 in the third channel group 1200C may be electrically connected to the second pad 1202c on the package substrate 1201 through a second wire 1272c.

Under the above connection configuration, a first channel flag signal applied to the second pad 1202a on the package substrate 1201 may be transmitted to both the first and second semiconductor chips 1210A and 1220A in the first channel group 1200A, a second channel flag signal applied to the second pad 1202b on the package substrate 1201 may be transmitted to both the third and fourth semiconductor chips 1230B and 1240B in the second channel group 1200B. Similarly, a third channel flag signal applied to the second pad 1202c on the package substrate 1201 may be transmitted to both the fifth and sixth semiconductor chips 1250C and 1260C in the third channel group 1200C. In various embodiments, the first, second, and third flag signals may be independently and selectively applied to the second pads 1202a, 1202b, and 1202c, respectively. That is, only one of the first, second, and third flag signals may be selectively applied for a predetermined duration. For example, while one of the first, second, and third flag signals is applied, the others may not be applied. Alternatively, the first, second and third flag signals may be simultaneously applied to the second pads 1202a, 1202b, and 1202c, respectively. In such a case, one of the first, second and third flag signals may have a logic "high" level and the others may have logic "low" levels.

The first to sixth chip enable pads 1213, 1223, 1233, 1243, 1253, and 1263 may be input pads for transmitting the chip enable signals applied to the third pads 1203a and 1203b into the first to sixth semiconductor chips 1210A, 1220A, 1230B, 1240B, 1250C, and 1260C. One of the chip enable pads in the first channel group 1200A may be electrically connected to one of the chip enable pads in the second channel group 1200B and one of the chip enable pads in the third channel group 1200C. For example, the first chip enable pad 1213 of the first semiconductor chip 1210A in the first channel group 1200A, the third chip enable pad 1233 of the third semiconductor chip 1230B in the second channel group 1200B, and the fifth chip enable pad 1253 of the fifth semiconductor chip 1250C in the third channel group 1200C may be electrically connected to the third pad 1203a on the package substrate 1201 through a first interconnection line 1273a. Similarly, the second chip enable pad 1223 of the second semiconductor chip 1220A in the first channel group 1200A, the fourth chip enable pad 1243 of the fourth semiconductor chip 1240B in the second channel group 1200B, and the sixth chip enable pad 1263 of the sixth semiconductor chip 1260C in the third channel group 1200C may be electrically connected to the third pad 1203b on the package substrate 1201 through a second interconnection line 1273b. The first and second interconnection lines 1273a and 1273b may include conductive lines disposed in the package substrate, but not limited thereto.

Under the above connection configuration, a first chip enable signal applied to the third pad 1203a on the package substrate may be transmitted to the first semiconductor chip 1210A in the first channel group 1200A, the third semiconductor chip 1230B in the second channel group 1200B and the fifth semiconductor chip 1250C in the third channel group 1200C. Similarly, a second chip enable signal applied to the third pad 1203b on the package substrate may be transmitted to all the second semiconductor chip 1220A in the first channel group 1200A, the fourth semiconductor chip 1240B in the second channel group 1200B and the sixth semiconductor chip 1260C in the third channel group 1200C. In various embodiments, the first and second chip enable signals may be independently and selectively applied to the third pads 1203a and 1203b, respectively. That is, only one of the first and second chip enable signals may be selectively applied for a predetermined duration. For example, while one of the first and second chip enable signals is applied, the other chip enable signal may not be applied. Alternatively, the first and second chip enable signals may be simultaneously applied to the third pads 1203a and 1203b, respectively. In such a case, one of the first and second chip enable signals may have a logic "high" level and the other chip enable signal may have a logic "low" level.

Each of the first to sixth buffers included in the first to sixth semiconductor chips 1210A, 1220A, 1230B, 1240B, 1250C, and 1260C may have substantially the same configuration as described with reference to in FIGS. 8 and 3. Further, a method of operating the system in package 1200 may also be substantially the same as described with reference to FIGS. 7 and 8.

According to the embodiments set forth above, data I/O pads of a plurality of semiconductor chips constituting a stack package may be electrically connected to each other through common wires. Thus, the number of the wires for electrically connecting the semiconductor chips with each other can be minimized to prevent or suppress electrical shortages between the wires and to reduce a size (e.g., a volume) of the stack package. In particular, even though the stack package has a multi-channel configuration, one of a plurality of channel groups may be selected using at least of one channel flag signal. Further, the plurality of channel groups may be configured to share chip enable signals. Thus, the number of pads (e.g., bond fingers) disposed on a package substrate may be reduced.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A stack package comprising:
a first semiconductor chip stacked on a package substrate; and
a second semiconductor chip stacked on a side of the first semiconductor chip opposite to the package substrate,
wherein the first semiconductor chip is between the package substrate and the second semiconductor chip,
wherein the first semiconductor chip includes first data I/O pads for transmitting data I/O signals, a first flag pad, disposed on a semiconductor substrate of the first semiconductor chip, for receiving a flag signal, and a first buffer for controlling a switching operation between the first data I/O pads and an internal circuit of the first semiconductor chip,
wherein the second semiconductor chip includes second data I/O pads for transmitting the data I/O signals, a second flag pad, disposed on a semiconductor substrate of the second semiconductor chip, for receiving the flag signal, and a second buffer for controlling a switching operation between the second data I/O pads and an internal circuit of the second semiconductor chip,
wherein the first data I/O pads are electrically connected to respective ones of the second data I/O pads through first wires, and the first flag pad is electrically connected to the second flag pad through a second wire,
wherein the package substrate includes a pad, the pad directly electrically connected to the first flag pad through the second wire, and
wherein the first flag pad is directly electrically connected to the second flag pad through the second wire.

2. The stack package of claim 1, wherein the second semiconductor chip is disposed on the first semiconductor chip such that the first data I/O pads and the first flag pad are exposed.

3. The stack package of claim 1, wherein the number of the first data I/O pads is equal to the number of the data I/O signals, and the number of the second data I/O pads is equal to the number of the data I/O signals.

4. The stack package of claim 1, wherein the first semiconductor chip further includes a first power supply terminal for receiving a first power voltage signal and the second semiconductor chip further includes a second power supply terminal for receiving a second power voltage signal.

5. The stack package of claim 4, wherein one of the first and second power voltage signals has a logic high level and the other power voltage signal has a logic low level.

6. The stack package of claim 4, wherein the first buffer includes:
an exclusive NOR gate configured to generate an output signal in response to the flag signal and the first power voltage signal; and
a switching portion configured to control a switching operation between the first data I/O pads and the internal circuit of the first semiconductor chip in response to the output signal of the exclusive NOR gate.

7. The stack package of claim 6, wherein the switching portion includes:
a control input terminal configured for receiving the output signal generated from the exclusive NOR gate, the control input terminal being electrically connected to respective gates of transistors having respective drain electrodes electrically connected to respective ones of the first data I/O terminals and respective source electrodes electrically connected to respective ones of the second data I/O terminals; and wherein the first data I/O terminals are electrically connected to the respective ones of the first data I/O pads and the second data I/O terminals are electrically connected to the internal circuit of the first semiconductor chip.

8. The stack package of claim 7, wherein the transistors comprise of NMOS transistors configured to be substantially simultaneously turned on or turned off in response to the output signal received from the control input terminal.

9. The stack package of claim 4, wherein the second buffer includes:
an exclusive NOR gate configured to generate an output signal in response to the flag signal and the second power voltage signal; and
a switching portion configured to control a switching operation between the second data I/O pads and the internal circuit of the second semiconductor chip in response to the output signal of the exclusive NOR gate.

10. The stack package of claim 9, wherein the switching portion includes:
a control input terminal configured for receiving the output signal generated from the exclusive NOR gate, the control input terminal being electrically connected to respective gates of transistors having respective drain electrodes electrically connected to respective ones of the first data I/O terminals and respective source electrodes electrically connected to respective ones of the second data I/O terminals; and
wherein the first data I/O terminals are electrically connected to the respective ones of the second data I/O pads and the second data I/O terminals are electrically connected to the internal circuit of the second semiconductor chip.

11. The stack package of claim 10, wherein the transistors comprise of NMOS transistors configured to be substantially simultaneously turned on or turned off in response to the output signal received from the control input terminal.

12. The stack package of claim 1, wherein in response to the flag signal, one of the first and second buffers is switched on to transmit the data I/O signals to the internal circuit of the semiconductor chip including the switched-on buffer and the other buffer is switched off to electrically disconnect the first wires from the internal circuit of the semiconductor chip including the switched-off buffer.

13. A stack package comprising:
a plurality of semiconductor chips in a first channel group and a plurality of semiconductor chips in a second channel group, the plurality of semiconductor chips in the second channel group stacked on the plurality of semiconductor chips in the first channel group and the plurality of semiconductor chips in the first channel group stacked on a package substrate,
wherein each of the plurality of semiconductor chips in the first and second channel groups includes data I/O pads for transmitting data I/O signals, a flag pad, disposed on a semiconductor substrate of each, respective, semiconductor chip from the plurality of semiconductor chips, for receiving a flag signal, a chip enable pad for receiving a chip enable signal, and a buffer for controlling a switching operation between the data I/O pads and an internal circuit of the corresponding semiconductor chip, wherein the data I/O pads of one of the plurality of semiconductor chips in the first and second channel groups are electrically connected to the data I/O pads of the other semiconductor chips through first wires, and the flag pads of the plurality of semiconductor chips in the first and second channel groups is electrically connected to each other through a second wire, wherein the chip enable pads of the plurality of semiconductor chips in the first channel group are electrically connected to respective ones of the chip enable pads of the plurality of semiconductor chips in the second channel group, wherein the package substrate includes a pad, the pad directly electrically connected, through the second wire, to a first channel flag pad of a first semiconductor chip included in the first channel group and stacked on the package substrate, wherein a second semiconductor chip, included in the first channel group, is stacked between the first semiconductor chip and a third semiconductor chip included in the second channel group, and includes a second channel flag pad, and wherein the second channel flag pad is directly electrically connected to the first channel flag pad of the first semiconductor chip through the second wire.

14. The stack package of claim 13, wherein the plurality of semiconductor chips in the first and second channel groups are stacked on the package substrate such that at least first edges of the plurality of semiconductor chips in the first and second channel groups exhibit a step shape.

15. The stack package of claim 13, wherein the number of the data I/O pads of each of the semiconductor chips corresponds to the number of the data I/O signals.

16. The stack package of claim 13, wherein the number of the semiconductor chips in the first channel group is equal to the number of the semiconductor chips in the second channel group.

17. The stack package of claim 13:
wherein the number of the semiconductor chips in each of the first and second channel groups is two; and
wherein a first chip enable signal having a first logic level is applied to one of the chip enable pads of the semiconductor chips in the first channel group and one of the chip enable pads of the semiconductor chips in the second channel group, and a second chip enable signal having a second logic level is applied to the other of the chip enable pads of the semiconductor chips in the first channel group and the other of the chip enable pads of the semiconductor chips in the second channel group.

18. The stack package of claim 17, wherein the semiconductor chips substantially sequentially receive the first and second chip enable signals.

19. The stack package of claim 17, wherein the semiconductor chips substantially simultaneously receive the first and second chip enable signals.

20. The stack package of claim 13, wherein each of the semiconductor chips further includes a power supply pad for receiving a power voltage signal.

21. The stack package of claim 20, wherein a logic level of the power voltage signal applied to the power supply pads of the semiconductor chips in the first channel group is different from a logic level of the power voltage signal applied to the power supply pads of the semiconductor chips in the second channel group.

22. The stack package of claim 20, wherein the buffer includes:
- an exclusive NOR gate configured to generate an output signal in response to the flag signal and the power voltage signal;
- an AND gate configured to generate an output signal in response to the output signal of the exclusive NOR gate and the chip enable signal; and
- a switching portion configured to control a switching operation between the data I/O pads and the internal circuit of the corresponding semiconductor chip in response to the output signal of the AND gate.

23. A stack package comprising:
- at least three channel groups stacked on a package substrate, a first channel group stacked on a second channel group, the second channel group stacked on a third channel group, and the third channel group stacked on the package substrate,
- wherein each of the at least three channel groups includes a plurality of semiconductor chips,
- wherein each of the plurality of semiconductor chips includes data I/O pads for transmitting data I/O signals, a flag pad, disposed on a semiconductor substrate of each, respective, semiconductor chip from the plurality of semiconductor chips, for receiving a flag signal, a chip enable pad for receiving a chip enable signal, and a buffer for controlling a switching operation between the data I/O pads and an internal circuit of the corresponding semiconductor chip,
- wherein the data I/O pads of one of the plurality of semiconductor chips are electrically connected to the data I/O pads of the other semiconductor chips through first wires, and the flag pads of the plurality of semiconductor chips in each of the at least three channel groups are electrically connected to each other through a second wire,
- wherein the chip enable pads in one of the at least three channel groups are electrically connected to respective ones of the chip enable pads in each of the other channel groups,
- wherein the package substrate includes a pad, the pad directly electrically connected, through the second wire, to a first channel flag pad of a first semiconductor chip included in the first channel group and stacked on the package substrate,
- wherein a second semiconductor chip, included in the first channel group, is stacked between the first semiconductor chip and a third semiconductor chip included in the second channel group, and includes a second channel flag pad, and
- wherein the second channel flag pad is directly electrically connected to the first channel flag pad of the first semiconductor chip through the second wire.

24. The stack package of claim 23, wherein the data I/O signals, flag signals, and chip enable signals are sequentially processed by the plurality of semiconductor chips.

25. The stack package of claim 23, wherein the plurality of semiconductor chips in the at least three channel groups are stacked on the package substrate such that at least first edges of the plurality of semiconductor chips in the at least three channel groups exhibit a step shape.

26. The stack package of claim 23, wherein the number of the data I/O pads of each of the semiconductor chips corresponds to the number of the data I/O signals.

27. The stack package of claim 23, wherein the number of the semiconductor chips in one of the at least three channel groups is equal to the number of the semiconductor chips in each of the other channel groups.

28. The stack package of claim 23, further comprising substrate pads disposed on the package substrate and electrically connected to the flag pads of the semiconductor chips,
- wherein the number of the substrate pads is equal to the number of the at least three channel groups.

29. The stack package of claim 23:
- wherein the number of the semiconductor chips in each of the first and second channel groups is two; and
- wherein a first chip enable signal having a first logic level is applied to one of the chip enable pads of the semiconductor chips in each of the at least three channel groups, and a second chip enable signal having a second logic level is applied to the other of the chip enable pads of the semiconductor chips in each of the at least three channel groups.

30. The stack package of claim 23, wherein the buffer includes:
- an AND gate configured to generate an output signal in response to the chip enable signal and the flag signal; and
- a switching portion configured to control a switching operation between the data I/O pads and the internal circuit of the corresponding semiconductor chip in response to the output signal of the AND gate.

* * * * *